(12) United States Patent
Nishida et al.

(10) Patent No.: US 6,864,128 B2
(45) Date of Patent: Mar. 8, 2005

(54) MANUFACTURING METHOD FOR A SEMICONDUCTOR DEVICE

(75) Inventors: Yukio Nishida, Tokyo (JP); Kazunobu Ohta, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 43 days.

(21) Appl. No.: 10/623,563

(22) Filed: Jul. 22, 2003

(65) Prior Publication Data

US 2004/0180522 A1 Sep. 16, 2004

(30) Foreign Application Priority Data

Mar. 12, 2003 (JP) .......................... 2003-066293

(51) Int. Cl.⁷ .......................... H01L 21/00; H01L 21/84; H01L 21/8238; H01L 21/336
(52) U.S. Cl. .................. 438/153; 438/154; 438/199; 438/216; 438/230; 438/286; 438/287
(58) Field of Search ................. 438/153, 154, 438/199, 216, 230, 286, 287

(56) References Cited

U.S. PATENT DOCUMENTS

| | | | |
|---|---|---|---|
| 6,506,649 B2 * | 1/2003 | Fung et al. | 438/300 |
| 6,541,320 B2 * | 4/2003 | Brown et al. | 438/197 |
| 2002/0100945 A1 | 8/2002 | Mandelman et al. | |

FOREIGN PATENT DOCUMENTS

| | | |
|---|---|---|
| JP | 9-82958 | 3/1997 |
| JP | 2002-305287 | 10/2001 |
| JP | 2002-222947 | 8/2002 |

OTHER PUBLICATIONS

T. Ghani, et al., IEDM Technical Digest, pp. 415–418, "100 NM Gate Length High Performance/Low Power CMOS Transistor Structure", 1999.

T. Matsumoto, et al., IEDM Technical Digest, pp. 219–222. "70 NM SOI–CMOS of 135 GH$_z$ $f_{max}$ With Dual Offset–Implanted Source–Drain Extension Structure for RF/Analog and Logic Applications", 2001.

K. Ota, et al., Extended Abstracts of the 2001 International Conference on Solid State Devices and Materials, pp. 148–149, "80 NM High Performance CMOSFET With Low Gate Leakage Current Using Conventional Thin Gate Nitric Oxide", 2001.

* cited by examiner

Primary Examiner—David E. Graybill
(74) Attorney, Agent, or Firm—Oblon, Spivak, McClelland, Maier & Neustadt, P.C.

(57) ABSTRACT

A gate insulating film 4, two polysilicon films 5 and 7, and a silicon nitride film 9 are successively laminated on a semiconductor substrate 1 in this order. Each of the polysilicon films 5 and 7 contains phosphorus. The polysilicon film 5 has a region having a phosphorus concentration higher than that of the polysilicon film 7. Gate electrodes 10n, 10p, 40n, and 40p are formed on the gate insulating film 4 by partly etching the polysilicon films 5 and 7 and the silicon nitride film 9. In this case, the etching rate of the region of the polysilicon film 5, having a phosphorus concentration higher than that of the polysilicon film 7, is higher than that of the polysilicon film 7. Due to this difference, notches are formed at the bottom portions on side surfaces of respective gate electrodes 10p, 40n, and 40p.

5 Claims, 15 Drawing Sheets

MANUFACTURING METHOD FOR A SEMICONDUCTOR DEVICE

BACKGROUND OF THE INVENTION

1. Field of the Invention

This invention relates to a manufacturing method for a semiconductor device having a notch on the side surface of a gate electrode.

2. Description of the Background Art

To improve the performance of semiconductor devices, development of MOS transistors possessing excellent properties is earnestly required. Furthermore, to realize speedy operations of the semiconductor devices, it is necessary to increase the drain current of the MOS transistor and reduce its parasitic capacitance. Especially, an overlap capacitance appearing in a region where a gate electrode and a source/drain region are overlapped via a gate insulating film gives a significant influence to the transistor characteristics. Hence, reducing the overlap capacitance is a target to be attained.

T. Ghani, et al., IEDM Technical Digest, pp.415–418, 1999 (hereinafter, referred to as non-patent document 1), discloses a method of reducing the overlap capacitance. According to the technique disclosed in the non-patent document 1, a notch is provided at the bottom portion of a gate electrode to reduce the region where a gate electrode and a source/drain region are overlapped via a gate insulating film (hereinafter, referred to as "gate overlap amount Lov"), to reduce the overlap capacitance.

According to the technique disclosed in the non-patent document 1, the formation of notch is limited to the bottom portion of the gate electrode. The gate length of the bottom portion of the gate electrode is shorter than the gate length of its upper portion. Accordingly, the overlap capacitance can be reduced. It becomes possible to obtain a short gate length which was not realized by the ordinary processes. Furthermore, even in the case that a notch is formed at the gate electrode, the gate resistance does not increase because the gate length of an upper portion of the gate electrode remains constant.

Another method of forming a notch at the gate electrode of a MOS transistor is for example disclosed in the Japanese Patent Application Laid-open No. 2002-222947 (hereinafter, referred to as patent document 1) or in the Japanese Patent Application Laid-open No. 9-82958(1997) (hereinafter, referred to as patent document 2). The notch forming method disclosed in the patent document 1 or 2 is based on the characteristics that an oxidizing speed on the sidewall of the gate electrode varies depending on the concentration of impurities contained in the gate electrode. Furthermore, Japanese Patent Application Laid-open No. 2002-305287 discloses a different type of notch forming method.

Although the above-described method of providing a notch on the side surface of the gate electrode is effective in reducing the overlap capacitance, it is also possible to use another method of, for example, providing double sidewalls on the side surface of the gate electrode to reduce the gate overlap amount Lov as disclosed in T. Matumoto, et. al., IEDM Technical Digest, pp.219–222, 2001 (hereinafter, referred to as non-patent document 2) or in K. Ohta, et. al., Extended Abstracts of the 2001 International Conference on SSDM, pp.148–149, 2001 (hereinafter, referred to as non-patent document 3).

As described above, according to the patent documents 1 and 2, the notch is formed by oxidizing the sidewall of the gate electrode and hence the following problem will be caused.

In general, accurately controlling the oxidized amount of the gate electrode is so difficult that, in many cases, the sidewall of the gate electrode is excessively oxidized beyond a portion where the oxidization should be stopped. Thus, it is difficult to obtain desired notch configuration.

In ordinary cases, reducing the gate overlap amount Lov to reduce the overlap capacitance leads to increase in the parasitic resistance of the source/drain region and reduction in the drain current. Accordingly, reduction in the overlap capacitance and increase in the drain current are generally in a tradeoff relationship. Hence, optimizing the performance of the transistor can be realized by designing the gate overlap amount Lov to an appropriate value and accurately implementing it.

However, as described above, according to the techniques disclosed in the above-described patent documents 1 and 2, it is difficult to obtain desired notch configuration. Accurately realizing the gate overlap amount Lov is difficult. Therefore, the techniques disclosed in the above-described patent documents 1 and 2 cannot optimize the performance of the transistor.

SUMMARY OF THE INVENTION

In view of the above-described problems, it is an object of the present invention to provide a technique for forming notches on the side surfaces of gate electrodes so that the notches can be configured into desirable shape.

According to the present invention, a method of manufacturing a semiconductor device includes the following steps (a) to (e). The step (a) is performed for forming a gate insulating film on a semiconductor substrate. The step (b) is performed for forming a first polysilicon film containing n-type impurities on the gate insulating film. The step (c) is performed for forming a second polysilicon film on the first polysilicon film. The second polysilicon film is a polysilicon film containing the above impurities and having a concentration of the impurities lower than that of the first polysilicon film or a non-doped polysilicon film. The step (d) is performed for forming a gate electrode including the first and second polysilicon films on the gate insulating film by partly etching the first and second polysilicon films from the above of the second polysilcon film. And, the step (e) is performed for forming a sidewall on side surface of the gate electrode after accomplishing the step (d). The etching applied to the first and second polysilicon films in the step (d) forms an etched side surface of the first polysilicon film recessed compared with that of the second polysilicon film, thereby leaving a notch on the side surface of the gate electrode. And, the step (e) is performed in such a manner that the notch is filled with the sidewall.

Forming the notch on the side surface of the gate electrode by etching is performed by utilizing the characteristics that the speed of etching applied to the polysilicon film changes depending on the concentration of the contained n-type impurities. Accordingly, compared with oxidizing the side surface of the gate electrode to form the notch, the manufacturing method of the present invention can improve the controllability in configuring the notch into desirable shape.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

FIGS. 1 to 7 are cross-sectional views sequentially showing the processes of a manufacturing method for a semiconductor device in accordance with a first embodiment of the present invention. The semiconductor device in accordance with the first embodiment is, for example, a system on chip (SoC) constituted by a logic device and a high-frequency device. Each of the logic device and the high-frequency device includes an nMOS transistor and a pMOS transistor.

The semiconductor device in accordance with the first embodiment has a single gate structure characterized in that an nMOS transistor and a pMOS transistor have n-type gate electrodes. Furthermore, the first embodiment of the present invention is characterized in that the nMOS transistor has a surface channel structure and the pMOS transistor has a buried channel structure. Hereinafter, the manufacturing method for a semiconductor device in accordance with the first embodiment of the present invention will be explained with reference to FIGS. 1 to 7.

Figure 1:
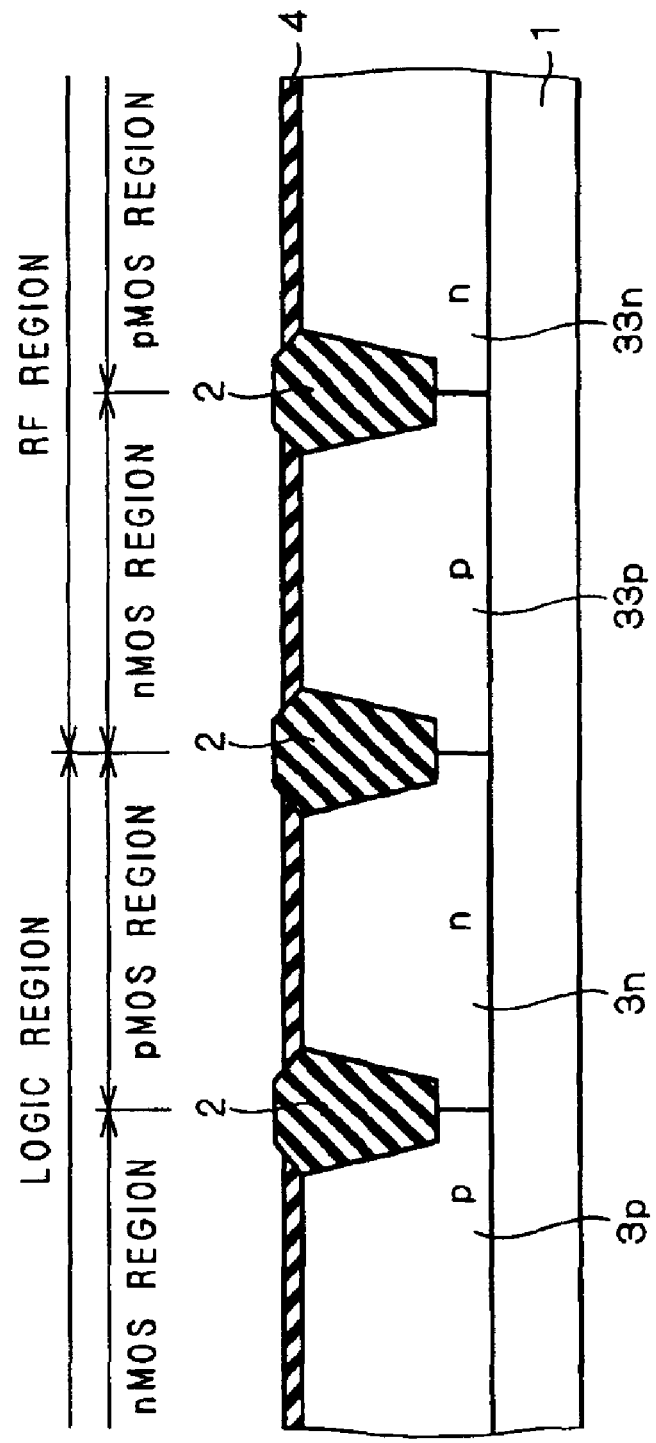
FIGS. 1 to 7 are cross-sectional views sequentially showing the processes of a manufacturing method for a semiconductor device in accordance with a first embodiment of the present invention.

First, as shown in FIG. 1, element isolation insulating films 2 are formed in the upper surface of a semiconductor substrate 1 which is for example made of a p-type silicon substrate by a LOCOS isolation technique or a trench isolation technique which are both well known.

The element isolation insulating films 2, each of which is for example made of a silicon oxide film, separate the upper surface of the semiconductor device 1 into a plurality of regions.

Next, as shown in FIG. 1, in a region where a logic device is formed (hereinafter, referred to as "logic region"), a p-type well region 3p is formed in the upper surface of the semiconductor substrate 1 in a region where an nMOS transistor is formed (hereinafter referred to as "nMOS region") and an n-type well region 3n is formed in the upper surface of the semiconductor substrate 1 in a region where a pMOS transistor is formed (hereinafter referred to as "pMOS region"). Furthermore, in a region where a high-frequency device is formed (hereinafter, referred to as "RF region"), a p-type well region 33p is formed in the upper surface of the semiconductor substrate 1 in an nMOS region and an n-type well region 33n is formed in the upper surface of the semiconductor substrate 1 in a pMOS region. Furthermore, a buried layer (not shown) serving as a p-type buried channel is formed in each of the well regions 3n and 33n Next, the semiconductor substrate 1 is oxidized from above to form a gate insulating film 4, having a film thickness of for example 3.0 nm, on the semiconductor substrate 1.

Figure 2:
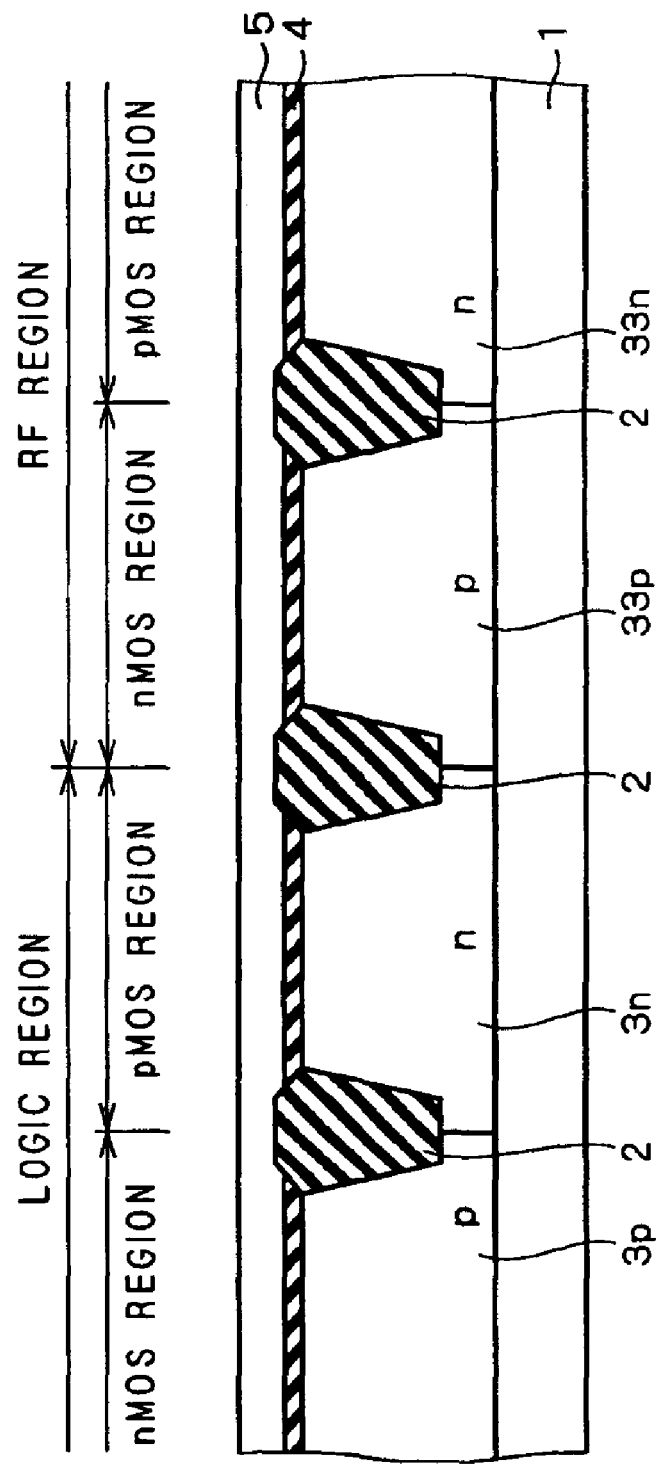

Next, as shown in FIG. 2, a polysilicon film 5 having a thickness of for example 10 nm is formed on the gate insulating film 4 and on the element isolation insulating films 2. The polysilicon film 5 is a doped polysilicon film uniformly containing n-type impurities, such as phosphorus atoms, at the concentration of $1\times10^{19}/cm^3$. For example, the polysilicon film 5 can be formed by CVD growth in a material gas containing phosphorus compound such as $PCl_3$ (i.e., phosphorus trichloride).

Figure 3:
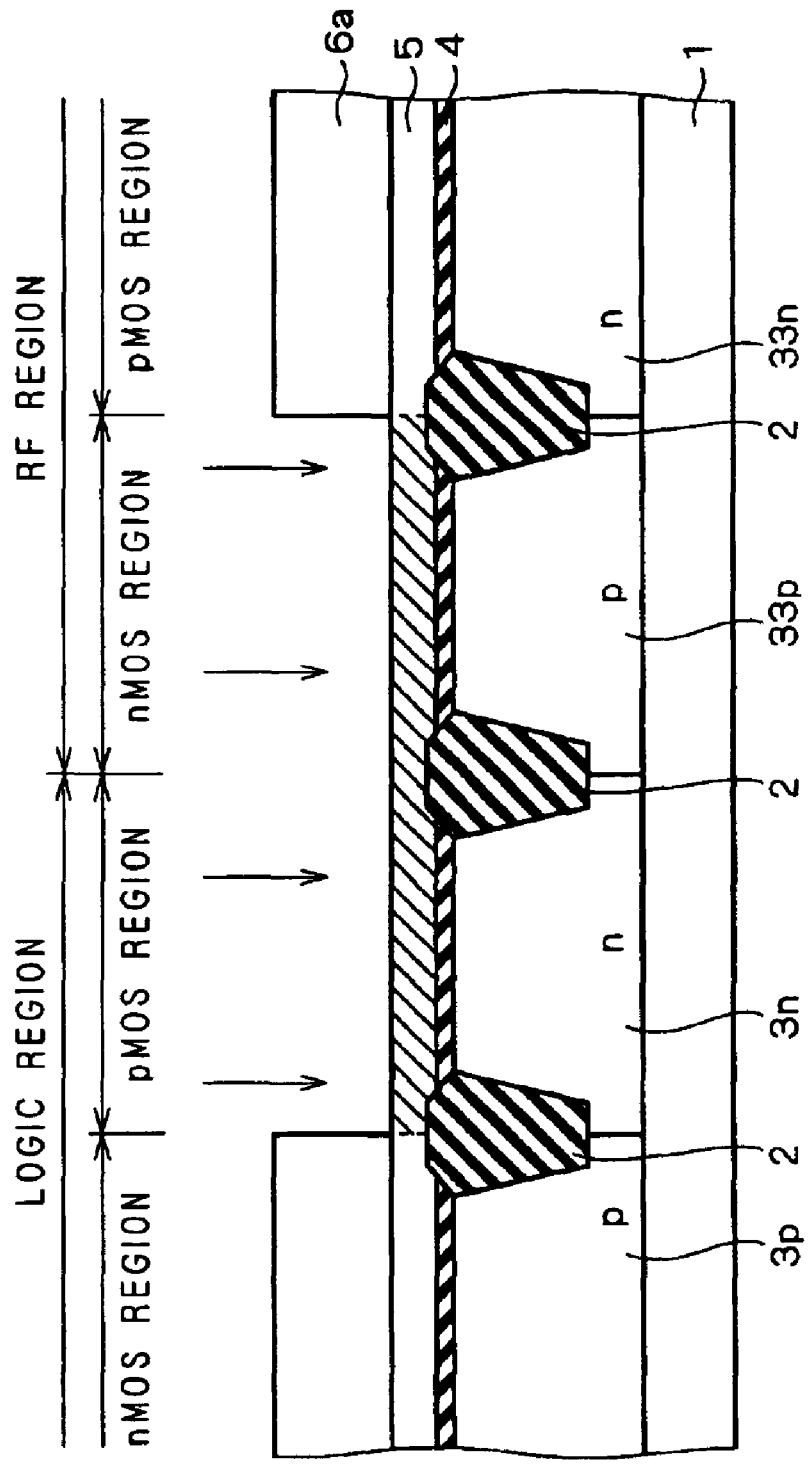

Next, as shown in FIG. 3, a photoresist 6a is formed on the polysilicon film 5. The photoresist 6a has an aperture pattern exposing the pMOS region of the logic region and the nMOS region of the RF region. With the photoresist 6a serving as a mask, the ion-implantation using phosphorus is applied to the polysilicon film 5 to have the phosphorus concentration of $5\times10^{20}/cm^3$ in the pMOS region of the logic region and also in the nMOS region of the RF region. In this case, the energy of the phosphorus ion-implantation is set to a lower level, e.g., 3 keV, so that no phosphorus ions reach a layer locating beneath the polysilicon film 5. Then, the photoresist 6a is removed. In the drawing, the region of the polysilicon film 5 having the phosphorus concentration of $5\times10^{20}/cm^3$ is hatched by right ascending lines.

Figure 4:
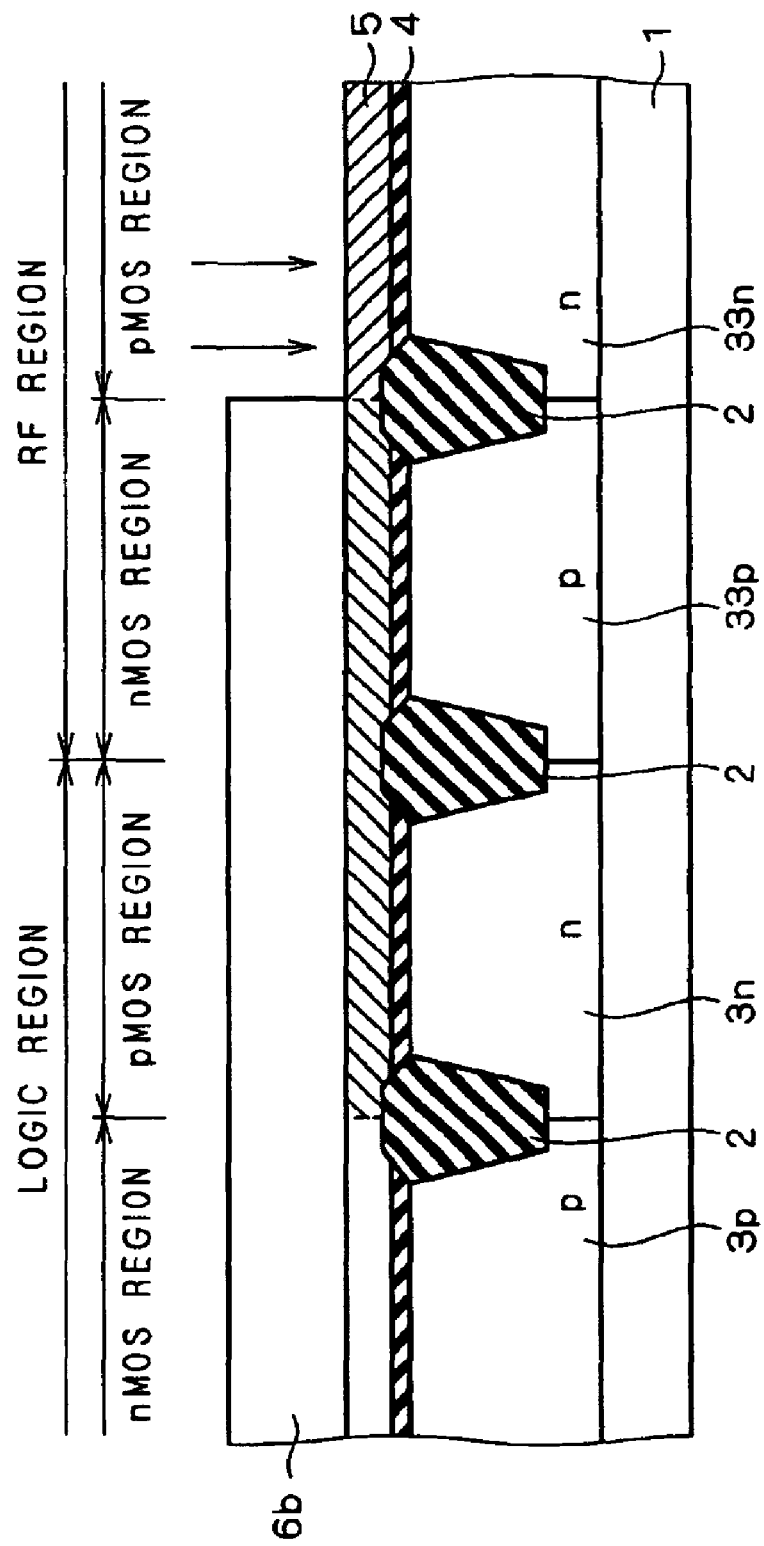

Next, as shown in FIG. 4, a photoresist 6b having an aperture pattern exposing the pMOS region of the RF region is formed on the polysilicon film 5. Then, the phosphorus ion-implantation is performed with a greater implanting amount compared with the above-described ion-implantation applied to the polysilicon film 5 in the pMOS region of the logic region and in the nMOS region of the RF region. More specifically, with the photoresist 6b serving as a mask, the phosphorus ion-implantation is applied to the polysilicon film 5 to have the phosphorus concentration of $9\times10^{20}/cm^3$ in the pMOS region of the RF region. In this case, the energy of the ion-implantation is set to a lower level, e.g., 3 keV, so that no phosphorus ions reach a layer locating beneath the polysilicon film 5. Then, the photoresist 6b is removed. In the drawing, the region of the polysilicon film 5 having the phosphorus concentration of $9\times10^{20}/cm^3$ is hatched by left ascending lines.

As described above, no ion-implantation is applied to the polycilicon film 5 in the nMOS region of the logic region. In other words, the phosphorus concentration of the polycilicon film 5 in the nMOS region of the logic region is kept at the level of $1\times10^{19}/cm^3$. On the other hand, the ion-implantation is applied to the polycilicon film 5 in the pMOS region of the logic region and in the nMOS region of the RF region to have the above-described phosphorus concentrations.

Figure 5:
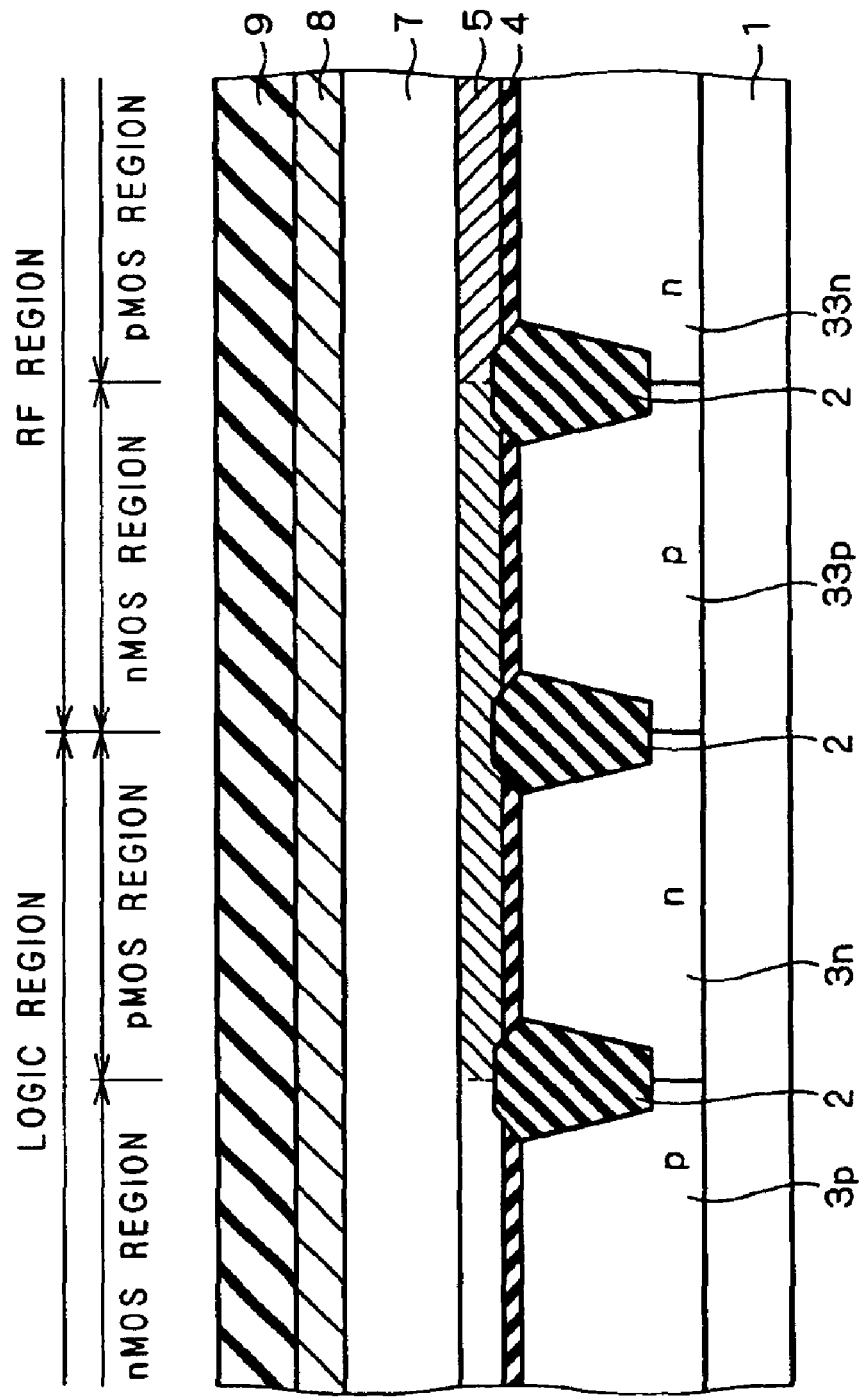

Next, as shown in FIG. 5, a polysilicon film 7 having a thickness of for example 200 nm is formed on the polysilicon film 5. Like the polysilicon film 5 being not yet subjected to the phosphorus ion-implantation, the polysilicon film 7 is a doped polysilicon film uniformly containing n-type impurities, such as phosphorus atoms, at the concentration of $1\times10^{19}/cm^3$. For example, the polysilicon film 7 can be formed by CVD growth in a material gas containing phosphorus compound such as $PCl_3$ (i.e., phosphorus trichloride).

Then, to reduce a gate resistance, a metallic film 8 made of, for example, tungsten (W) is formed on the polysilicon film 7. A silicon nitride film 9, to be used as a hard mask in a later process, is formed on the metallic film 8.

Next, a photoresist (not shown) having a predetermined aperture pattern is formed on the silicon nitride film 9. The silicon nitride film 9 is patterned with this photoresist serving as a mask. Then, the metallic film 8 is etched with the silicon nitride film 9 having been thus patterned.

Figure 6:
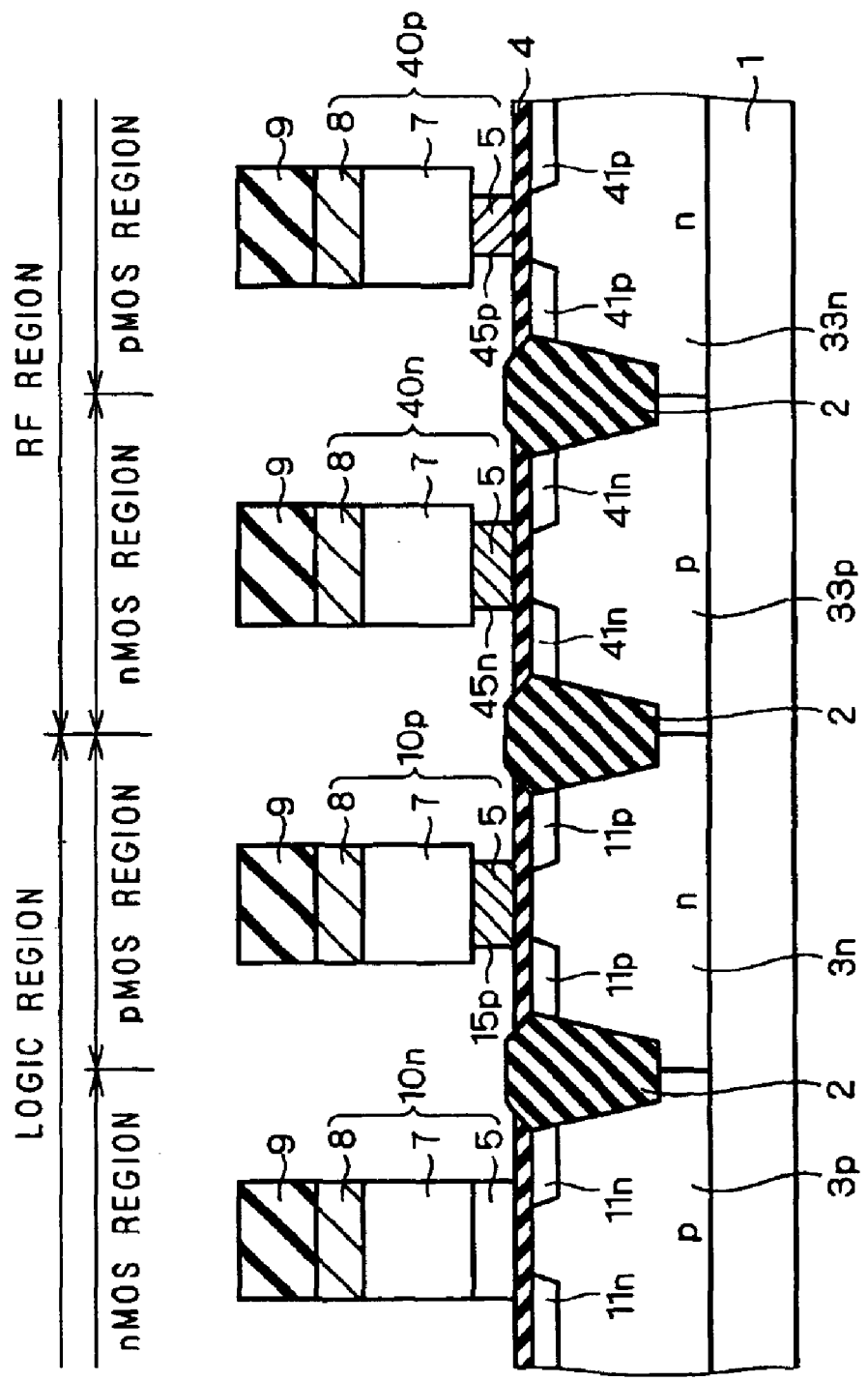

Next, with the silicon nitride film 9 serving again as a mask and the gate insulating film 4 serving as an etching stopper, both of the polysilicon films 7 and 5 are successively etched by plasma anisotropic etching. This etching leaves, as shown in FIG. 6, gate electrodes 10n and 10p formed on the gate insulating film 4 in the nMOS region and the pMOS region of the logic region and also leaves gate electrodes 40n and 40p formed on the gate insulating film 4 in the nMOS region and the pMOS region of the RF region.

The gate electrode 10n includes the polysilicon film 5 having the phosphorus concentration of $1\times10^{19}/cm^3$, the polysilicon film 7, and the metallic film 8. Each of the gate electrodes 10p and 40n includes the polysilicon film 5 having the phosphorus concentration of $5\times10^{20}/cm^3$, the polysilicon film 7, and the metallic film 8. The gate electrode 40p includes the polysilicon film 5 having the phosphorus concentration of $9\times10^{20}/cm^3$, the polysilicon film 7, and the metallic film 8. The silicon nitride film 9 is formed on the upper surface of respective gate electrodes 10n, 10p, 40n and 40p. Furthermore, a notch is formed at the bottom portion on the side surface of respective gate electrodes 10p, 40n and 40p.

In general, the speed of etching applied to the polysilicon film becomes high with increasing concentration of n-type impurities contained in the polysilicon film. According to the first embodiment of the present invention, in each of the pMOS region of the logic region, the nMOS region and the pMOS region of the RF region, the polysilicon film 5 serving as a lower layer has the phosphorus concentration higher than that of the polysilicon film 7 serving as an upper layer. Thus, the etching rate of the polysilicon film 5 is higher than that of the polysilicon film 7. As a result, in each of the gate electrodes 10p, 40n, and 40p, the side surface of the polysilicon film 5 is recessed compared with the side surface of the polysilicon film 7. Thus, the notch is formed at the bottom portion on the side surface of respective gate electrodes 10p, 40n, and 40p.

Furthermore, according to the first embodiment of the present invention, the polysilicon film 5 in the pMOS region of the logic region and the polysilicon film 5 in the nMOS region of the RF region have the same phosphorus concentration. The polysilicon film 5 in the pMOS region of the RF region has a higher phosphorus concentration compared with the polysilicon film 5 in the pMOS region of the logic region and the polysilicon film 5 in the nMOS region of the RF region. Accordingly, the notch 15p formed at the gate electrode 10p is identical in size with the notch 45n formed at the gate electrode 40n. The notch 45p formed at the gate electrode 40p is large compared with the notches 15p and 45n. No notch is formed on the side surface of the gate electrode 10n located in the nMOS region of the logic region because the polysilicon films 5 and 7 have the same phosphorus concentration.

Controlling the size of respective notches formed at the bottom portions on the side surfaces of respective gate electrodes is easily performed by adjusting the etching conditions, the film thickness of polysilicon film 5, or the difference in impurity concentration between the lower-layer polysilicon film 5 and the upper-layer polysilicon film 7.

According to the first embodiment of the present invention, a mixed gas of $Cl_2$ and $O_2$ is used for etching the polysilicon films 5 and 7. For example, increasing the percentage of $Cl_2$ in the mixed gas makes it possible to provide a larger notch. Furthermore, increasing the pressure of the mixed gas or decreasing the RF power is effective to provide a larger notch.

Next, a photoresist (not shown), having an aperture pattern exposing the pMOS regions of the logic region and the RF region, is formed on the gate insulating film 4 and on the element isolation insulating films 2. With this photoresist and the silicon nitride films 9 each serving as a mask, the ion-implantation using, for example, boron is performed. Then, after finishing the boron ion-implantation, the photoresist is removed. Thus, p-type extension regions 11p serving as p-type impurity regions are formed in the upper surface of the well region 3n, as shown in FIG. 6. Meanwhile, p-type extension regions 41p serving as p-type impurity regions are formed in the upper surface of the well region 33n.

Next, a photoresist (not shown), having an aperture pattern exposing the nMOS regions of the logic region and the RF region, is formed on the gate insulating film 4 and on the element isolation insulating films 2. With this photoresist and the silicon nitride films 9 each serving as a mask, the ion-implantation using, for example, arsenic is performed. Then, after finishing the arsenic ion-implantation, the photoresist is removed. Thus, n-type extension regions 11n serving as n-type impurity regions are formed in the upper surface of the well region 3p, as shown in FIG. 6. Meanwhile, n-type extension regions 41n serving as n-type impurity regions are formed along the upper surface of the well region 33p.

Figure 7:
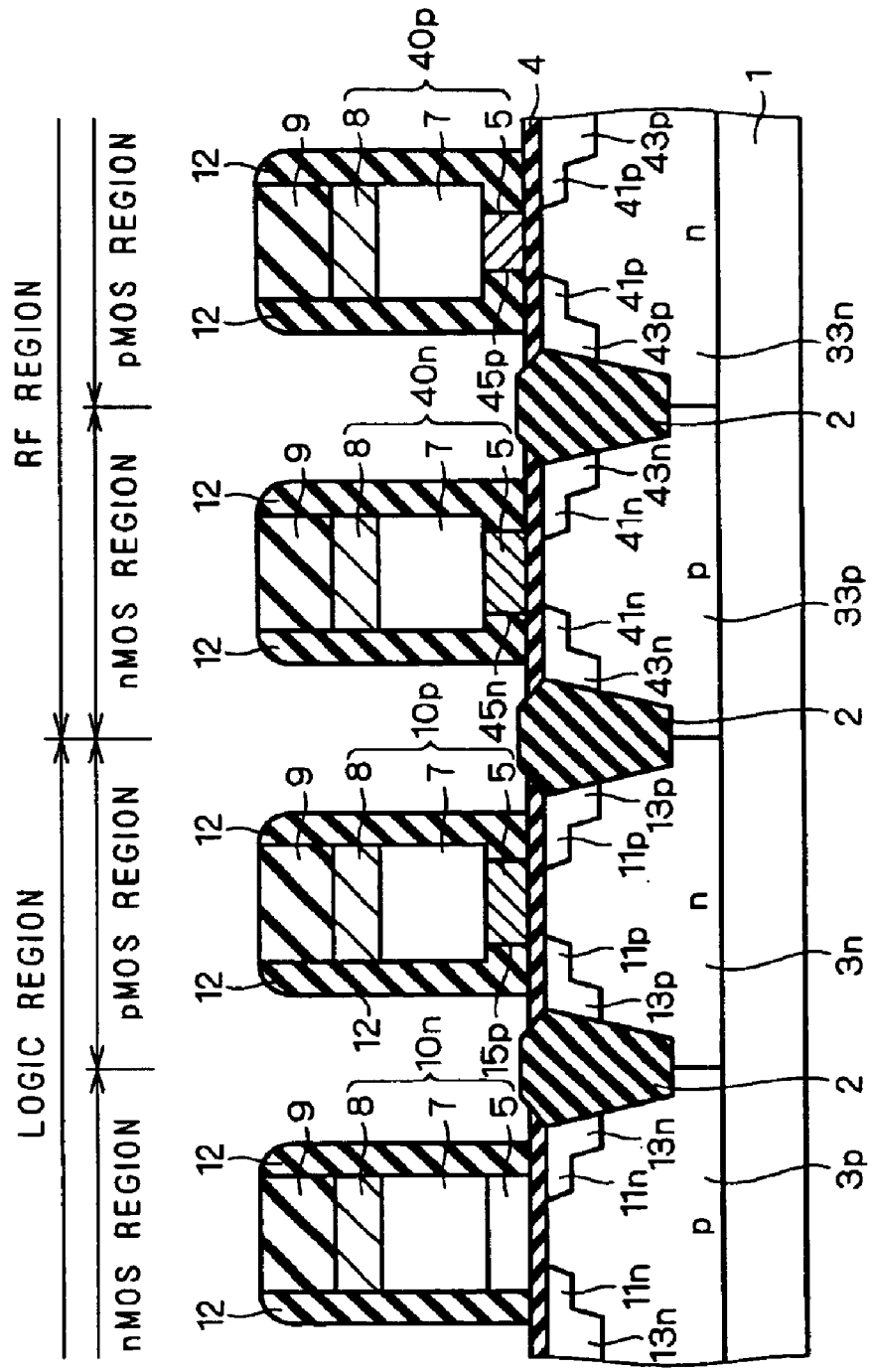

Next, a silicon nitride film serving as filler for the notches 15p, 45n, and 45p is deposited on the entire surface. Then, the applied silicon nitride film is subjected to the anisotropic dry etching having a higher etching rate in the depth direction of the semiconductor substrate 1, to leave sidewalls 12 made of the silicon nitride film on the side surfaces of respective gate electrodes 10n, 10p, 40n, and 40p and also on the side surfaces of silicon nitride films 9 as shown in FIG. 7. Accordingly, respective notches 15p, 45n, and 45p are filled with the sidewalls 12.

Next, p-type impurity regions 13p and 43p are formed in the upper surface of the well regions 3n and 33n, respectively, and n-type impurity regions 13n and 43n are formed in the upper surface of the well regions 3p and 33p, respectively. More specifically, first of all, a photoresist (not shown) having an aperture pattern exposing the pMOS regions of the logic region and the RF region is formed on the gate insulating film 4 and on the element isolation insulating films 2. With this photoresist, the silicon nitride films 9, and the sidewalls 12 each serving as a mask, the ion-implantation using, for example, boron is performed. Then, after finishing the boron ion-implantation, the photoresist is removed. The boron ion-implanting amount in this case is set to be higher than the boron ion-implanting amount in the formation of p-type extension regions 11p and 41p. With this setting, as shown in FIG. 7, p-type impurity regions 13p having an impurity concentration higher than that of the p-type extension regions 1p are formed in the upper surface of the well region 3n. Meanwhile, p-type impurity regions 43p having an impurity concentration higher than that of the p-type extension regions 41p are formed in the upper surface of the well region 33n.

Next, a photoresist (not shown) having an aperture pattern exposing the nMOS regions of the logic region and the RF region is formed on the gate insulating film 4 and on the element isolation insulating films 2. With this photoresist, the silicon nitride films 9, and the sidewalls 12 each serving as a mask, the ion-implantation using, for example, arsenic is performed. Then, after finishing the arsenic ion-implantation, the photoresist is removed. The arsenic ion-implanting amount in this case is set to be higher than the arsenic ion-implanting amount in the formation of n-type extension regions 11n and 41n. With this setting, as shown in FIG. 7, n-type impurity regions 13n having an impurity concentration higher than that of the n-type extension regions 11n are formed in the upper surface of the well region 3p. Meanwhile, n-type impurity regions 43n having an impurity concentration higher than that of the n-type extension regions 41n are formed in the upper surface of the well region 33p.

Through the above-described processes, a plurality of source/drain regions respectively constituted by the p-type extension region 11p and the p-type impurity region 13p and mutually spaced at a predetermined distance are provided in the upper surface of the well region 3n. On the other hand, a plurality of source/drain regions respectively constituted by the p-type extension region 41p and the p-type impurity region 43p and mutually spaced at a predetermined distance are provided in the upper surface of the well region 33n.

Furthermore, a plurality of source/drain regions respectively constituted by the n-type extension region 11n and the n-type impurity region 13n and mutually spaced at a predetermined distance are provided in the upper surface of the well region 3p. On the other hand, a plurality of source/drain regions respectively constituted by the n-type extension region 41n and the n-type impurity region 43n and mutually spaced at a predetermined distance are provided in the upper surface of the well region 33p.

Next, an annealing treatment is performed to activate the impurities contained in the above-described source/drain regions. Through this annealing treatment, the pMOS transistor having a buried channel structure is formed in each of the pMOS regions of the logic region and the RF region, while the nMOS transistor having a surface channel structure is formed in each of the nMOS regions of the logic region and the RF region.

According to the semiconductor device in accordance with the first embodiment of the present invention, as shown in FIG. 7, no notch is formed in the nMOS transistor of the logic region and the notches are formed in the pMOS transistor of the logic region and in the nMOS transistor of the RF region. Accordingly, the nMOS transistor in the logic region has the gate overlap amount Lov larger than that of the pMOS transistor in the logic region and that of the nMOS transistor in the RF region.

Furthermore, the notches 15p and 45n formed in the pMOS transistor of the logic region and the nMOS transistor of the RF region are smaller than the notch 45p formed in the pMOS transistor of the RF region. Accordingly, the pMOS transistor in the logic region and the nMOS transistor in the RF region have the gate overlap amount Lov larger than that of the pMOS transistor in the RF region.

In this manner, according to the manufacturing method for the semiconductor device in accordance with the first embodiment of the present invention, the characteristics that the speed of etching applied to the polysilicon film changes depending on the concentration of the contained n-type impurities is utilized to form the notches at the bottom portions on the side surfaces of intended gate electrodes.

In general, compared with controlling the oxidation amount, controlling the etching amount is advantageous in that the etching is accurately controlled by adjusting the etching conditions. Accordingly, compared with the case that the notches are formed by oxidizing the sidewalls of the gate electrodes according to the techniques disclosed in the above-described patent documents 1 and 2, forming the notches on the side surfaces of the gate electrodes according to the etching of the first embodiment of the present invention can improve the controllability in configuring the notches into desirable shapes. Accordingly, the first embodiment of the present invention makes it possible to accurately realize a proper gate overlap amount Lov and optimize the performance of the semiconductor device.

Furthermore, according to the first embodiment of the present invention, the polysilicon film 5 includes a region having the phosphorus concentration of $5 \times 10^{20}/cm^3$ and a region having the phosphorus concentration of $9 \times 10^{20}/cm^3$. These regions are partly etched to form the notches mutually different in size at the gate electrodes 10p and 40n and the gate electrode 40p.

In this manner, providing a plurality of regions mutually different in the n-type impurity concentration in the lower-layer polysilicon film 5 makes it possible to form a plurality of gate electrodes having notches configured into desirable shape and mutually different in size. As a result, the gate overlap amount Lov can be optimized for each transistor. The overall performance of the semiconductor device can be improved. Hereinafter, the reasons will be explained.

In the above-described non-patent document 2, there is the description that the gate overlap amount Lov should be changed for each of the logic device and the high-frequency device in the same chip.

Regarding the logic device, it is important to operate at high speeds while realizing high current driving capability. Accordingly, it is desirable to set the gate overlap amount Lov to a relatively large value to reduce a parasitic resistance in the source/drain region. On the other hand, regarding the high-frequency device, the maximum oscillation frequency fmax, serving as one parameter indicating its performance is variable depending on the relationship between the smallness in the overlap capacitance and the highness in the mutual conductance of the transistors, in other words, the lowness in the parasitic resistance in the source/drain region. The maximum oscillation frequency fmax takes a maximum value at a certain value of the gate overlap amount Lov.

As described above, in some cases, the gate overlap amount Lov required for the logic device is different from the gate overlap amount Lov required for the high-frequency device. It is therefore desirable to independently control the gate overlap amount Lov for each of the logic device and the RF device.

According to the first embodiment of the present invention, as described above, the notch configuration can be optimized for each transistor. Hence, it is possible to independently optimize the gate overlap amount Lov for the logic device and the gate overlap amount Lov for the RF device. Accordingly, the overall performance of the semiconductor device can be improved. Furthermore, the first embodiment of the present invention shows an example in which the gate overlap amount Lov is optimized for each of the logic device and the high-frequency device. According to this example, the nMOS transistor of the high-frequency device has the gate overlap amount Lov being set to be smaller than that of the nMOS transistor of the logic device. The pMOS transistor of the high-frequency device has the gate overlap amount Lov being set to be smaller than that of the pMOS transistor of the logic device.

Furthermore, in the above-described non-patent document 3, there is the description that, when an nMOS transistor and a pMOS transistor are formed in the same chip, increasing the gate overlap amount of the nMOS transistor makes it possible to improve the operating speed of the semiconductor device.

According to the first embodiment of the present invention, as described above, the notch configuration can be optimized for each transistor. Hence, it is possible to independently optimize the gate overlap amount Lov for the nMOS transistor and the gate overlap amount Lov for the pMOS transistor. Accordingly, the first embodiment of the present invention makes it possible to provide a large gate overlap amount Lov for the nMOS transistor compared with that for the pMOS transistor as described in the above-described non-patent document 3. The operating speed of the semiconductor device can be improved.

Furthermore, according to the first embodiment of the present invention, in each of the logic region and the RF region, the notch formed in the nMOS transistor is larger than the notch formed in the pMOS transistor. Accordingly, the gate overlap amount Lov of the nMOS transistor is larger than that of the pMOS transistor.

Furthermore, regarding the structure obtained after accomplishing the phosphorus ion-implantation to the polysilicon film 5, it is possible to perform the annealing treatment prior to the etching applied to the polysilicon film 5. In this case, the phosphorus ions diffuse in the polysilicon film 5 until the phosphorus distribution in the polysilicon film 5 becomes uniform. Furthermore, according to the first embodiment of the present invention, the upper-layer polysilicon film 7 is the doped polysilicon film. The phosphorus distribution in this polysilicon film 7 is substantially uniform. Accordingly, the phosphorus concentration steeply changes in the boundary between the upper-layer polysilicon film 7 and the lower-layer polysilicon film 5. The speed of etching applied to the polysilicon film abruptly changes. Hence, a desirable notch configuration is easily obtained.

Second Embodiment

FIGS. 8 to 12 are cross-sectional views sequentially showing the processes of a manufacturing method for a semiconductor device in accordance with a second embodiment of the present invention. The semiconductor device in accordance with the second embodiment is, for example, a system on chip (SoC) constituted by a logic device and a high-frequency device. Each of the logic device and the high-frequency device includes an nMOS transistor and a pMOS transistor.

The semiconductor device in accordance with the second embodiment has a dual-gate structure characterized in that an nMOS transistor and a pMOS transistor have n-type and p-type gate electrodes, respectively. Furthermore, the second embodiment of the present invention is characterized in that each of the nMOS transistor and the pMOS transistor has a surface channel structure. Hereinafter, the manufacturing method for a semiconductor device in accordance with the second embodiment of the present invention will be explained with reference to FIGS. 8 to 12.

First, like the above-described first embodiment of the present invention, element isolation insulating films 2 are formed in the upper surface of a semiconductor substrate 1. Next, in the logic region, the well region 3p is formed in the upper surface of the semiconductor substrate 1 in the nMOS region and the well region 3n is formed in the upper surface of the semiconductor substrate 1 in the pMOS region. Furthermore, in the RF region, the well region 33p is formed in the upper surface of the semiconductor substrate 1 in the nMOS region and the well region 33n is formed in the upper surface of the semiconductor substrate 1 in the pMOS region. Through the above-described processes, the arrangement shown in FIG. 1 is obtained. The second embodiment of the present invention is different from the first embodiment of the present invention in that no buried layers are formed in the well regions 3n and 33n because both of the nMOS transistor and the pMOS transistor have the surface channel structure.

Figure 8:
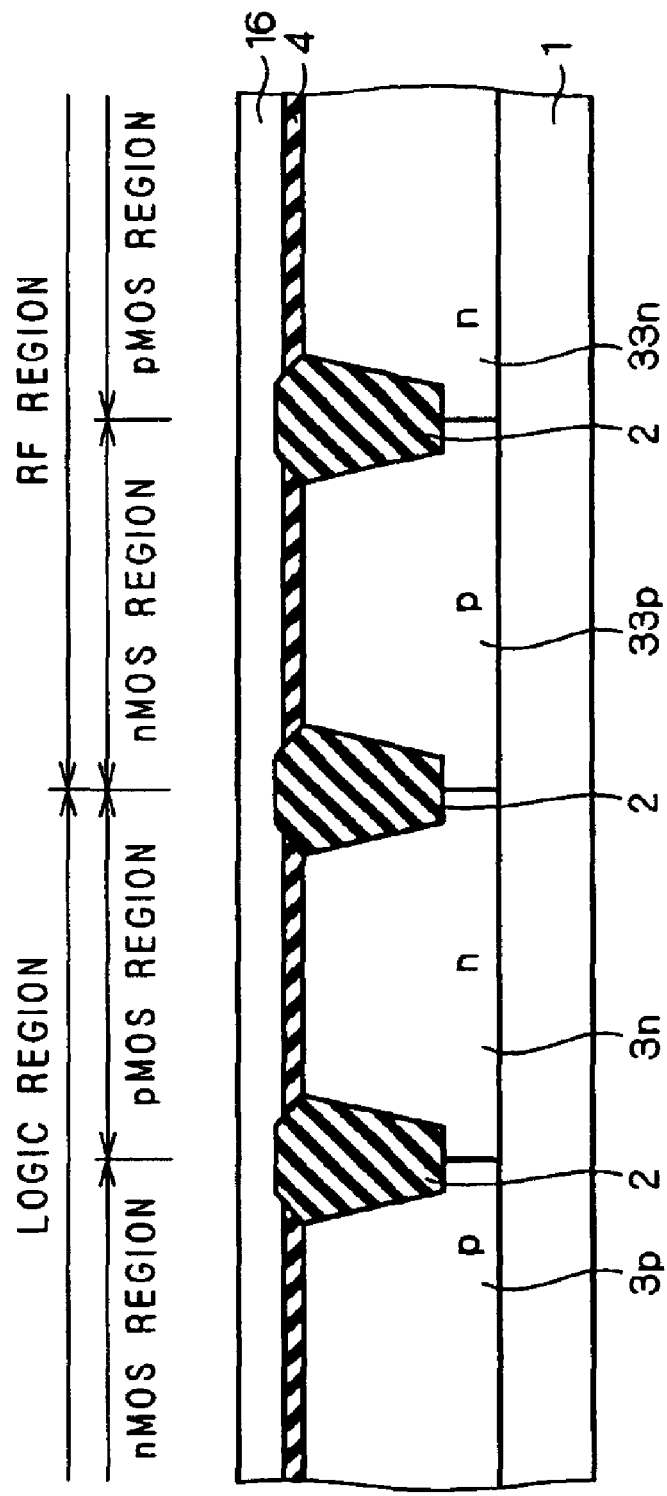
FIGS. 8 to 12 are cross-sectional views sequentially showing the processes of a manufacturing method for a semiconductor device in accordance with a second embodiment of the present invention.

Next, as shown in FIG. 8, a polysilicon film 16 having a thickness of for example 10 nm is formed on the gate insulating film 4 and on the element isolation insulating films 2. The polysilicon film 16 is a non-doped polysilicon film containing no impurities. For example, the polysilicon film 16 can be formed by CVD growth.

Figure 9:
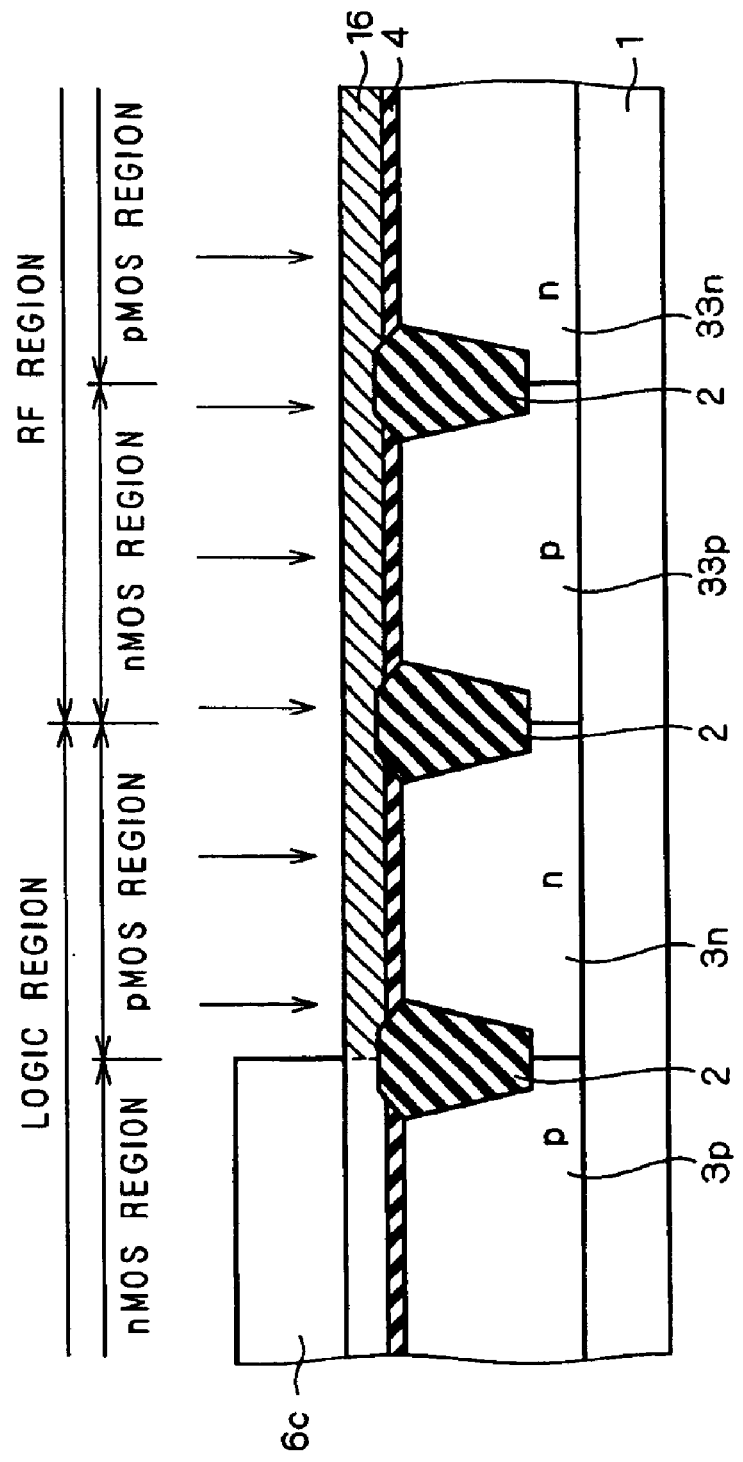

Next, as shown in FIG. 9, a photoresist 6c is formed on the polysilicon film 16. The photoresist 6c has an aperture pattern exposing the pMOS region of the logic region and both the nMOS region and the pMOS region of the RF region. With the photoresist 6c serving as a mask, the ion-implantation using phosphorus is applied to the polysilicon film 16. As a result, no phosphorus is implanted in the polysilicon film 16 at the nMOS region of the logic region. On the other hand, the polysilicon film 16 has the phosphorus concentration of $5 \times 10^{19}/cm^3$ in the pMOS region of the logic region and also in both the nMOS region and the pMOS region of the RF region. In this case, the energy of the phosphorus ion-implantation is set to a lower level, e.g., 3 keV, so that no phosphorus ions reach a layer locating beneath the polysilicon film 16. Then, the photoresist 6c is removed. In the drawing, the region of the polysilicon film 16 having the phosphorus concentration of $5 \times 10^{19}/cm^3$ is hatched by right ascending lines.

Figure 10:
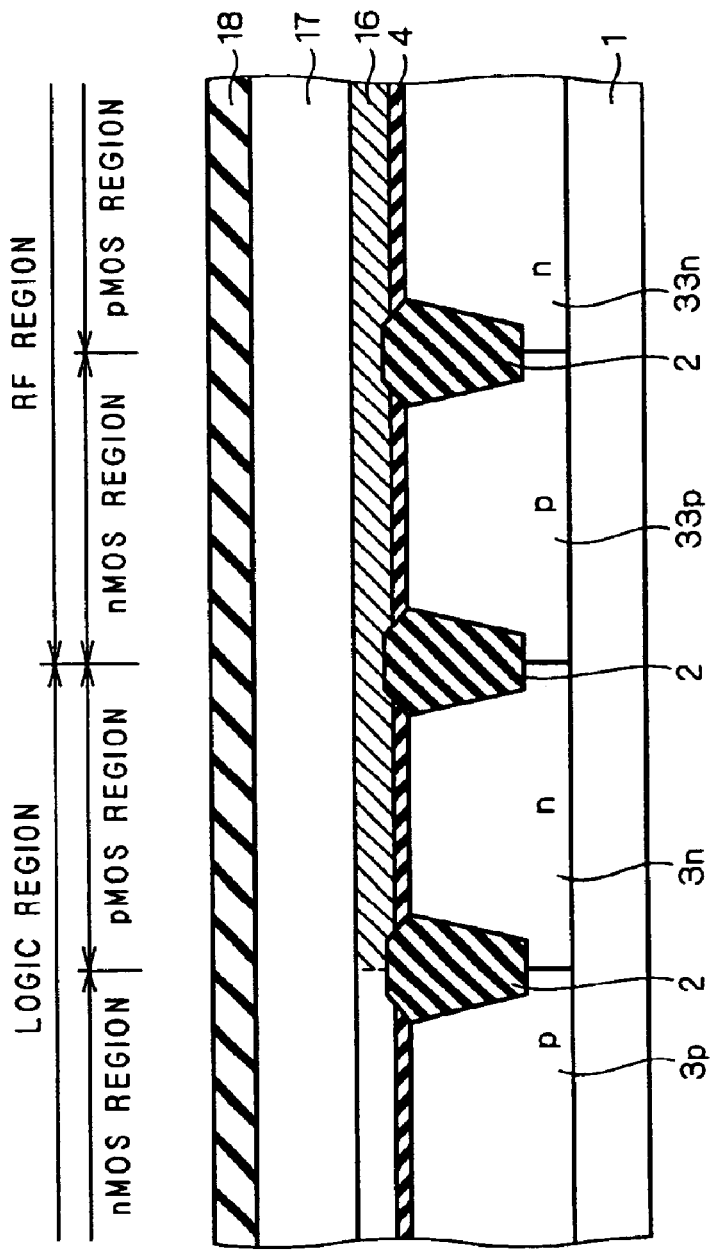

Next, as shown in FIG. 10, a polysilicon film 17 having a thickness of for example 200 nm is formed on the polysilicon film 16. Like the polysilicon film 16 having not been subjected to the ion-implantation, the polysilicon film 17 is a non-doped polysilicon film containing no impurities such as phosphorus. For example, the polysilicon film 17 can be formed by CVD growth. Then, a TEOS oxide film 18, to be used as a hard mask in a later process, is formed on the polysilicon film 17.

Figure 11:
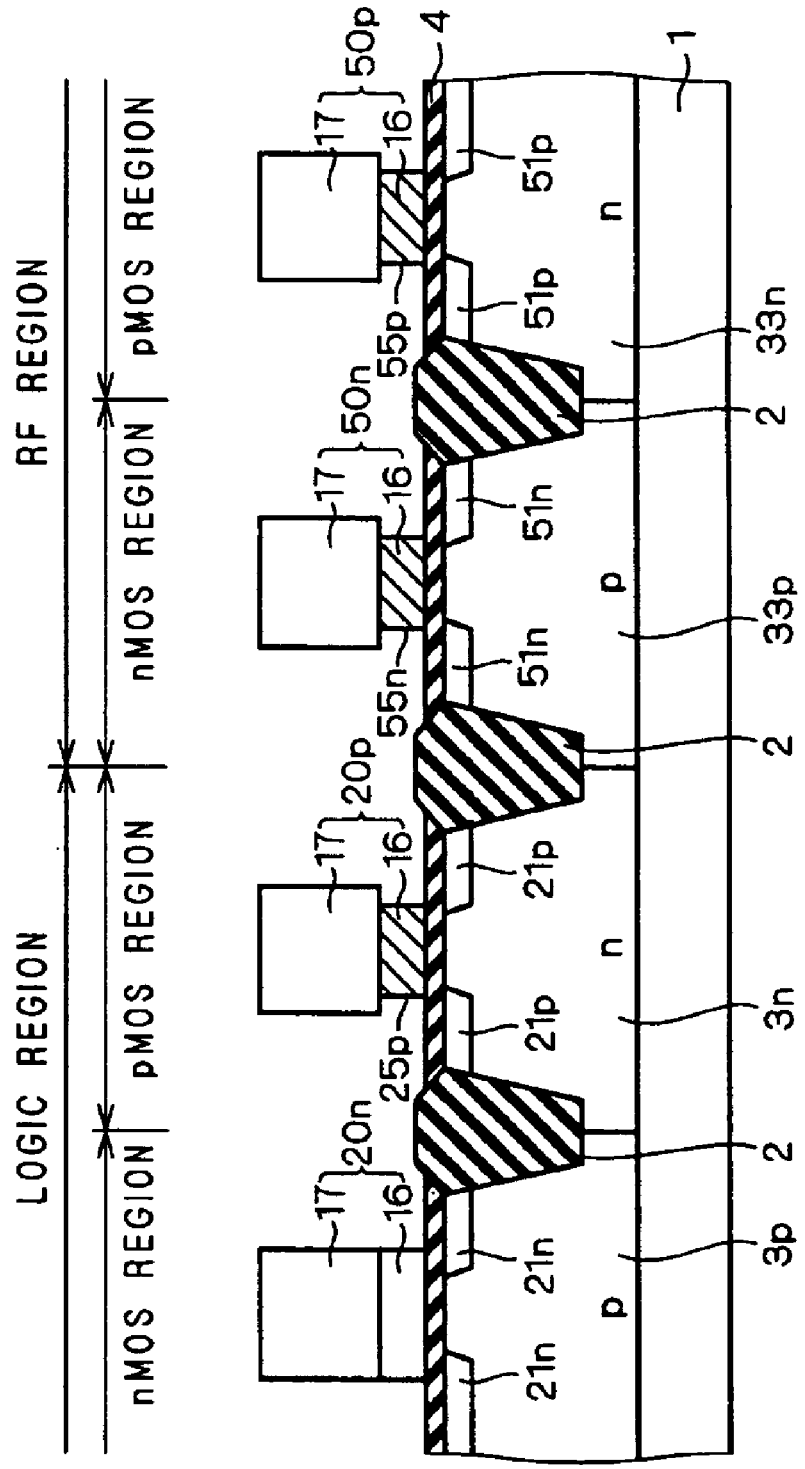

Next, a photoresist (not shown) having a predetermined aperture pattern is formed on the TEOS oxide film 18. The TEOS oxide film 18 is patterned with this photoresist serving as a mask. Then, with the patterned TEOS oxide film 18 serving as a mask and the gate insulating film 4 serving as an etching stopper, both the polysilicon films 17 and 16 are successively etched by plasma anisotropic etching. This etching leaves, as shown in FIG. 11, gate electrodes 20n and 20p formed on the gate insulating film 4 in the nMOS region and the pMOS region of the logic region and also leaves gate electrodes 50n and 50p formed on the gate insulating film 4 in the nMOS region and the pMOS region of the RF region. The TEOS oxide film 18 provided on the polysilicon films 17 substantially disappears at this moment.

The gate electrode 20n includes the polysilicon film 16 containing no impurities and the polysilicon film 17. Each of the gate electrodes 20p, 50n and 50p includes the polysilicon film 16 having the phosphorus concentration of $5 \times 10^{19}/cm^3$ and the polysilicon film 17. Furthermore, a notch is formed at the bottom portion on the side surface of respective gate electrodes 20p, 50n and 50p.

As described above, the speed of etching applied to the polysilicon film becomes high with increasing concentration of n-type impurities contained in the polysilicon film. According to the second embodiment of the present invention, in each of the pMOS region of the logic region, the nMOS region and the pMOS region of the RF region, the polysilicon film 17 serving as an upper layer contains no phosphorus and the polysilicon film 16 serving as a lower layer contains phosphorus. Thus, the etching rate of the polysilicon film 16 is higher than that of the polysilicon film 17. As a result, in each of the gate electrodes 20*p*, 50*n*, and 50*p*, the side surface of the polysilicon film 16 is recessed compared with the side surface of the polysilicon film 17. Thus, the notch is formed at the bottom portion on the side surface of respective gate electrodes 20*p*, 50*n*, and 50*p*.

Furthermore, according to the second embodiment of the present invention, the polysilicon film 16 in the pMOS region of the logic region, the polysilicon film 16 in the nMOS region of the RF region, and the polysilicon film 16 in the pMOS region of the RF region have the same phosphorus concentration. Accordingly, the notch 25*p* formed at the gate electrode 20*p* is identical in size with the notch 55*n* formed at the gate electrode 50*n* and is also identical in size with the notch 55*p* formed at the gate electrode 50*p*.

No notch is formed on the side surface of the gate electrode 20*n* located in the nMOS region of the logic region because both of the polysilicon films 16 and 17 contain no phosphorus.

Next, a photoresist (not shown), having an aperture pattern exposing the pMOS regions of the logic region and the RF region, is formed on the gate insulating film 4 and on the element isolation insulating films 2. With this photoresist serving as a mask, the ion-implantation using, for example, boron is performed. Then, after finishing the boron ion-implantation, the photoresist is removed. Thus, p-type extension regions 21*p* serving as p-type impurity regions are formed in the upper surface of the well region 3*n*, as shown in FIG. 11. Meanwhile, p-type extension regions 51*p* serving as p-type impurity regions are formed in the upper surface of the well region 33*n*.

Next, a photoresist (not shown), having an aperture pattern exposing the nMOS regions of the logic region and the RF region, is formed on the gate insulating film 4 and on the element isolation insulating films 2. With this photoresist serving as a mask, the ion-implantation using, for example, arsenic is performed. Then, after finishing the arsenic ion-implantation, the photoresist is removed. Thus, n-type extension regions 21*n* serving as n-type impurity regions are formed in the upper surface of the well region 3*p*, as shown in FIG. 11. Meanwhile, n-type extension regions 51*n* serving as n-type impurity regions are formed in the upper surface of the well region 33*p*.

Figure 12:
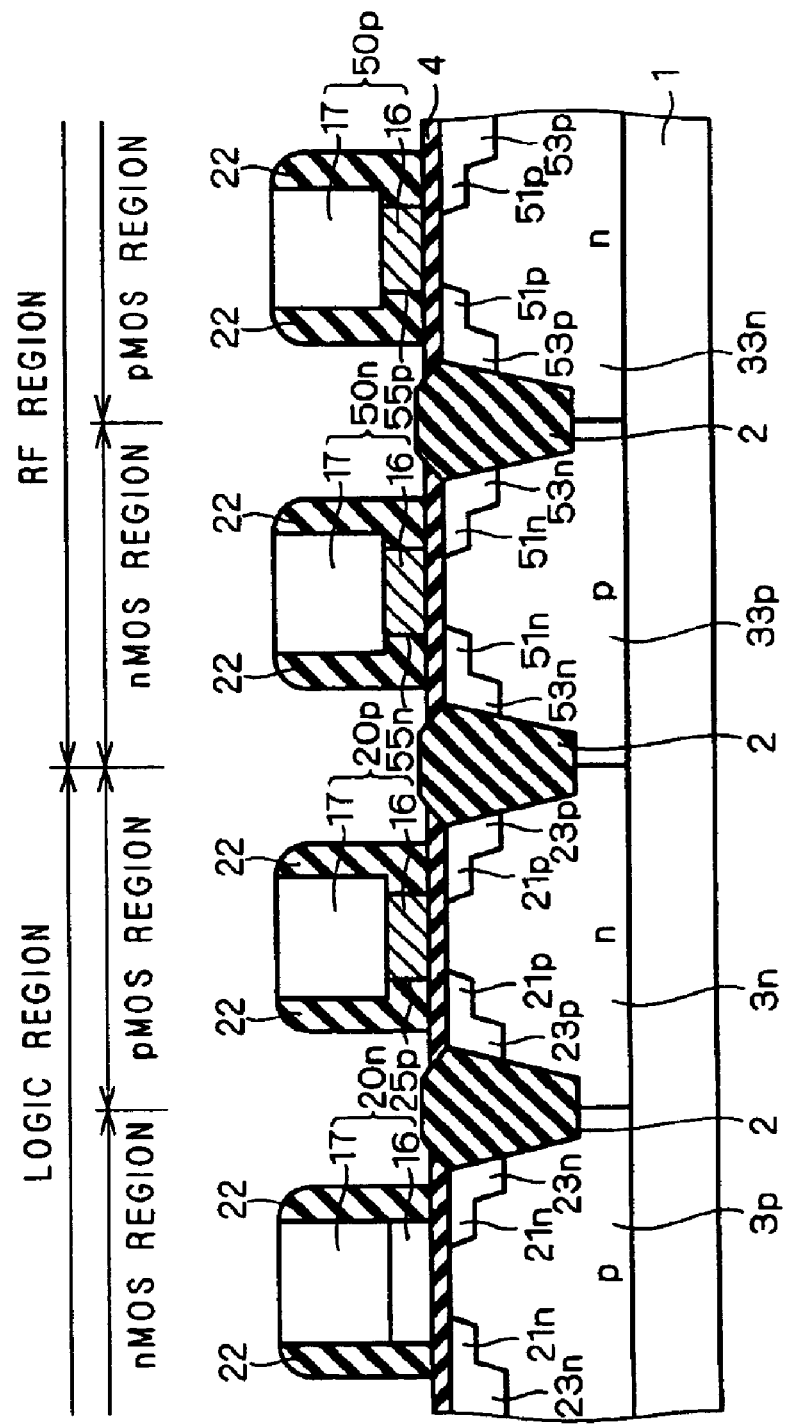

Next, a silicon nitride film serving as filler for the notches 25*p*, 55*n*, and 55*p* is deposited on the entire surface. Then, the applied silicon nitride film is subjected to the anisotropic dry etching having a higher etching rate in the depth direction of the semiconductor substrate 1, to leave sidewalls 22 made of the silicon nitride film on the side surfaces of respective gate electrodes 20*n*, 20*p*, 50*n*, and 50*p* as shown in FIG. 12. Accordingly, respective notches 25*p*, 55*n*, and 55*p* are filled with the sidewalls 22.

Next, p-type impurity regions 23*p* and 53*p* are formed in the upper surface of the well regions 3*n* and 33*n*, respectively, and n-type impurity regions 23*n* and 53*n* are formed in the upper surface of the well regions 3*p* and 33*p*, respectively. More specifically, first of all, a photoresist (not shown) having an aperture pattern exposing the pMOS regions of the logic region and the RF region is formed on the gate insulating film 4 and on the element isolation insulating films 2. With this photoresist and the sidewalls 22 each serving as a mask, the ion-implantation using, for example, boron is performed. Then, after finishing the boron ion-implantation, the photoresist is removed. The boron ion-implanting amount in this case is set to be higher than the boron ion-implanting amount in the formation of p-type extension regions 21*p* and 51*p*. With this setting, as shown in FIG. 12, p-type impurity regions 23*p* having an impurity concentration higher than that of the p-type extension regions 21*p* are formed in the upper surface of the well region 3*n*. Meanwhile, p-type impurity regions 53*p* having an impurity concentration higher than that of the p-type extension regions 51*p* are formed in the upper surface of the well region 33*n*.

Next, a photoresist (not shown) having an aperture pattern exposing the nMOS regions of the logic region and the RF region is formed on the gate insulating film 4 and on the element isolation insulating films 2. With this photoresist and the sidewalls 22 each serving as a mask, the ion-implantation using, for example, arsenic is performed. Then, after finishing the arsenic ion-implantation, the photoresist is removed. The arsenic ion-implanting amount in this case is set to be higher than the arsenic ion-implanting amount in the formation of n-type extension regions 21*n* and 51*n*. With this setting, as shown in FIG. 12, n-type impurity regions 23*n* having an impurity concentration higher than that of the n-type extension regions 21*n* are formed in the upper surface of the well region 3*p*. Meanwhile, n-type impurity regions 53*n* having an impurity concentration higher than that of the n-type extension regions 51*n* are formed in the upper surface of the well region 33*p*.

At this moment, the TEOS oxide film 18 used as the hard mask substantially disappears. Hence, the arsenic is also implanted into the gate electrodes 20*n* and 50*n* in the nMOS regions. The gate electrodes 20*n* and 50*n* become n type. Furthermore, in the formation of the p-type impurity regions 23*p* and 53*p*, the boron ion-implantation is performed with the implanting amount of $5 \times 10^{15}$ cm$^2$. The effect of phosphorus contained in the polysilicon film 16 of respective gate electrodes 20*p* and 50*p* located in the pMOS regions is canceled by the implanted boron. The gate electrodes 20*p* and 50*p* becomes p type. As a result, the dual-gate structure is realized.

Through the above-described processes, a plurality of source/drain regions respectively constituted by the p-type extension region 21*p* and the p-type impurity region 23*p* and mutually spaced at a predetermined distance are provided in the upper surface of the well region 3*n*. On the other hand, a plurality of source/drain regions respectively constituted by the p-type extension region 51*p* and the p-type impurity region 53*p* and mutually spaced at a predetermined distance are provided in the upper surface of the well region 33*n*.

Furthermore, a plurality of source/drain regions respectively constituted by the n-type extension region 21*n* and the n-type impurity region 23*n* and mutually spaced at a predetermined distance are provided in the upper surface of the well region 3*p*. On the other hand, a plurality of source/drain regions respectively constituted by the n-type extension region 51*n* and the n-type impurity region 53*n* and mutually spaced at a predetermined distance are provided in the upper surface of the well region 33*p*.

Next, an annealing treatment is performed to activate the impurities contained in the above-described source/drain regions. Through this annealing treatment, the pMOS transistor having a surface channel structure is formed in each of the pMOS regions of the logic region and the RF region, while the nMOS transistor having a surface channel structure is formed in each of the nMOS regions of the logic region and the RF region.

As described above, according to the manufacturing method for a semiconductor device in accordance with the second embodiment of the present invention, it is possible to form the notches having desirable configurations at respective gate electrodes even if the semiconductor device includes the nMOS transistor and the pMOS transistor each having the surface channel structure. Accordingly, the second embodiment of the present invention makes it possible to accurately realize a proper gate overlap amount Lov and optimize the performance of the semiconductor device.

Furthermore, according to the second embodiment of the present invention, both of the nMOS transistor and the pMOS transistor have the surface channel structure. This is advantageous in realizing a micro-structure for a semiconductor device, compared with the above-described first embodiment which is based on the semiconductor device including the pMOS transistor having a buried channel structure.

However, if the gate electrode in the pMOS region is insufficiently p type, it will cause depletion of the gate electrode. Thus, there is a restriction that the phosphorus concentration of the polysilicon film 16 in the pMOS region cannot be set to a higher value compared with the first embodiment. In this respect, the second embodiment has a disadvantage that the notch of the gate electrode in the pMOS region cannot be enlarged so much.

According to the second embodiment of the present invention, due to the above-described disadvantage, the phosphorus concentration of the polysilicon film 16 in the pMOS region of the RF region cannot be increased so much. This is the reason why the notch of the gate electrode 50p in the RF region is set to be identical in size with the notch of the gate electrode 20p in the logic region.

According to the second embodiment of the present invention, like the above-described first embodiment of the present invention, the gate overlap amount Lov can be optimized for each of the logic device and the high-frequency device. As a result, the semiconductor device of the second embodiment should be designed in such a manner that the gate overlap amount Lov for the nMOS transistor of the high-frequency device is smaller than that for the nMOS transistor of the logic device and also the gate overlap amount Lov for the pMOS transistor of the high-frequency device is smaller than that for the pMOS transistor of the logic device. Thus, the notch 55p formed in the gate electrode 50p in the pMOS region of the RF region should be enlarged compared with the notch 25p formed in the gate electrode 20p in the pMOS region of the logic region. However, due to the above-described reasons, the notch 55p is identical in size with the notch 25p.

However, FIGS. 12(a) and 12(b) of the above-described non-patent document 2 show that the maximum oscillation frequency fmax of the pMOS transistor of the high-frequency device does not sensitively vary depending on the gate overlap amount Lov compared with that of the nMOS transistor. It is thus believed that the influence given to the performance of the semiconductor device will be relatively small even if the notch formed in the pMOS region of the RF region is identical with the notch formed in the pMOS region of the logic region as disclosed in the second embodiment of the present invention.

According to the second embodiment of the present invention, as described above, the phosphorus concentration of the polysilicon film 16 in the pMOS region is set to be a smaller value to suppress the depletion of the gate electrode. However, in a case that increasing the maximum oscillation frequency fmax of the pMOS transistor of the high-frequency device is desirable than suppressing the depletion of the gate electrode, it will be preferable that the phosphorus concentration of the polysilicon film 16 in the pMOS region of the RF region is set to a higher value compared with that of the pMOS region of the logic region, so that the notch formed in the pMOS region of the RF region becomes larger than the notch formed in the pMOS region of the logic region as disclosed in the first embodiment of the present invention. More specifically, it is possible to increase the phosphorus concentration of the polysilicon film 16 in the pMOS region of the RF region in the following manner.

First of all, the structure shown in FIG. 8 is obtained. Next, a photoresist having an aperture pattern exposing the pMOS region of the logic region and the nMOS region of the RF region is formed on the polysilicon film 16. With this photoresist serving as a mask, the ion-implantation using phosphorus is applied to the polysilicon film 16 to have the phosphorus concentration of $5 \times 10^{19}/\text{cm}^3$ in the pMOS region of the logic region and also in the nMOS region of the RF region.

Next, a photoresist having an aperture pattern exposing the pMOS region of the RF region is formed on the polysilicon film 16. Then, the phosphorus ion-implantation is performed with a greater implanting amount compared with the above-described ion-implantation applied to the pMOS region of the logic region and also to the nMOS region of the RF region on the polysilicon film 16. More specifically, with the above-describe photoresist serving as a mask, the phosphorus ion-implantation is applied to the polysilicon film 16 to have the phosphorus concentration higher than $5 \times 10^{19}/\text{cm}^3$ in the pMOS region of the RF region. Then, as described above, the polysilicon films 17 and 16 are successively etched to form a plurality of gate electrodes with the notch formed in the pMOS region of the RF region being larger than the notch formed in the pMOS region of the logic region.

In this manner, providing a plurality of regions mutually different in the n-type impurity concentration in the lower-layer polysilicon film 16 makes it possible to form a plurality of gate electrodes having notches configured into desirable shape and mutually different in size. As a result, the gate overlap amount Lov can be optimized for each transistor.

Furthermore, regarding the structure obtained after accomplishing the phosphorus ion-implantation to the polysilicon film 16, it is possible to perform the annealing treatment prior to the etching applied to the polysilicon film 16. In this case, the phosphorus ions diffuse in the polysilicon film 16 until the phosphorus distribution in the polysilicon film 16 becomes uniform. Furthermore, according to the second embodiment of the present invention, the upper-layer polysilicon film 17 is the non-doped polysilicon film. Accordingly, the speed of etching applied to the polysilicon film abruptly changes. Hence, a desirable notch configuration is easily obtained.

Third Embodiment

FIGS. 13 to 17 are cross-sectional views sequentially showing the processes of a manufacturing method for a semiconductor device in accordance with a third embodiment of the present invention. The semiconductor device in accordance with the third embodiment includes, for example, a CMOS transistor having a single gate structure characterized in that an nMOS transistor and a pMOS transistor have n-type gate electrodes. The CMOS transistor of the third embodiment is, for example, a CMOS transistor incorporated in a memory-logic mixed mounting type semiconductor device according to which a logic device and a DRAM are formed on the same semiconductor substrate. According to the third embodiment of the present invention, the nMOS transistor has a surface channel structure and the pMOS transistor has a buried channel structure. Hereinafter, the manufacturing method for a semiconductor device in accordance with the third embodiment of the present invention will be explained with reference to FIGS. 13 to 17.

Figure 13:
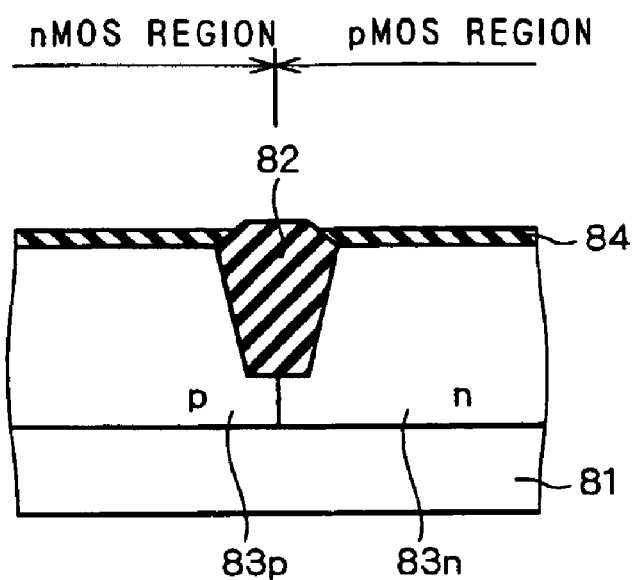
FIGS. 13 to 17 are cross-sectional views sequentially showing the processes of a manufacturing method for a semiconductor device in accordance with a third embodiment of the present invention.

First, as shown in FIG. 13, an element isolation insulating film 82 is formed in the upper surface of a semiconductor substrate 81 which is for example made of a p-type silicon substrate by a LOCOS isolation technique or a trench isolation technique which are both well known. The element isolation insulating film 2, which is for example made of a silicon oxide film, separates the upper surface of the semiconductor device 81 into a plurality of regions.

Next, a p-type well region 83p is formed in the upper surface of the semiconductor substrate 81 in the nMOS region. And, an n-type well region 83n is formed in the upper surface of the semiconductor substrate 81 in the pMOS region. Furthermore, a buried layer (not shown) is formed in the well region 83n.

Figure 14:
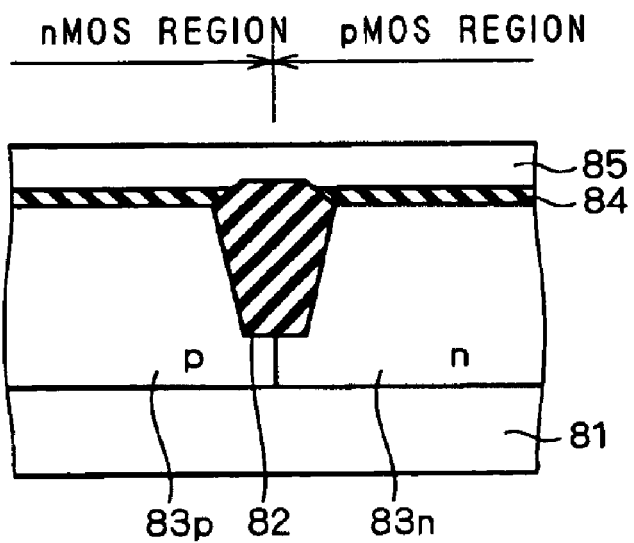

Next, the semiconductor substrate 81 is oxidized from above to form a gate insulating film 84, having a film thickness of for example 3.0 nm, on the semiconductor substrate 81. Next, as shown in FIG. 14, a polysilicon film 85 having a thickness of for example 10 nm is formed on the gate insulating film 84 and on the element isolation insulating film 82. The polysilicon film 85 is a doped polysilicon film uniformly containing n-type impurities, such as phosphorus atoms, at the concentration of $1 \times 10^{19}/cm^3$. For example, the polysilicon film 85 can be formed by CVD growth in a material gas containing phosphorus compound such as $PCl_3$ (i.e., phosphorus trichloride).

Figure 15:
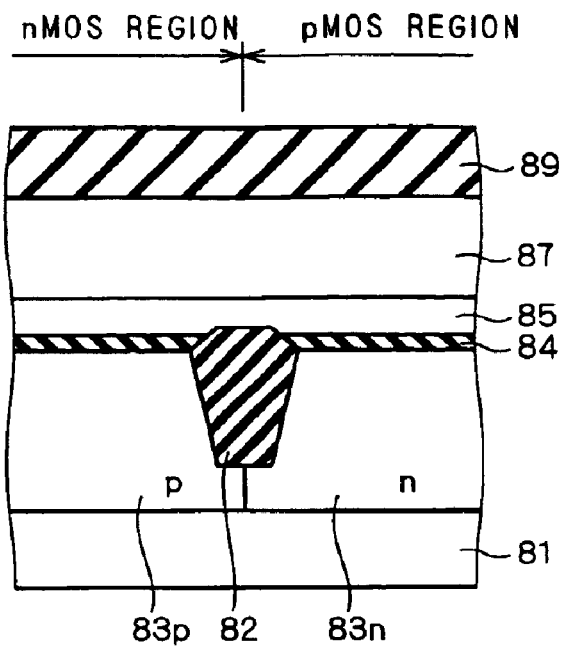

Next, as shown in FIG. 15, a polysilicon film 87 having a thickness of for example 200 nm is formed on the polysilicon film 85. The polysilicon film 87 is a doped polysilicon film uniformly containing n-type impurities, such as phosphorus atoms, at the concentration of $5 \times 10^{20}/cm^3$. The phosphorus concentration of the polysilicon film 87 is higher than that of the polysilicon film 85. The polysilicon film 87 can be formed by CVD growth in a material gas containing phosphorus compound such as $PCl_3$ (i.e., phosphorus trichloride).

Figure 16:
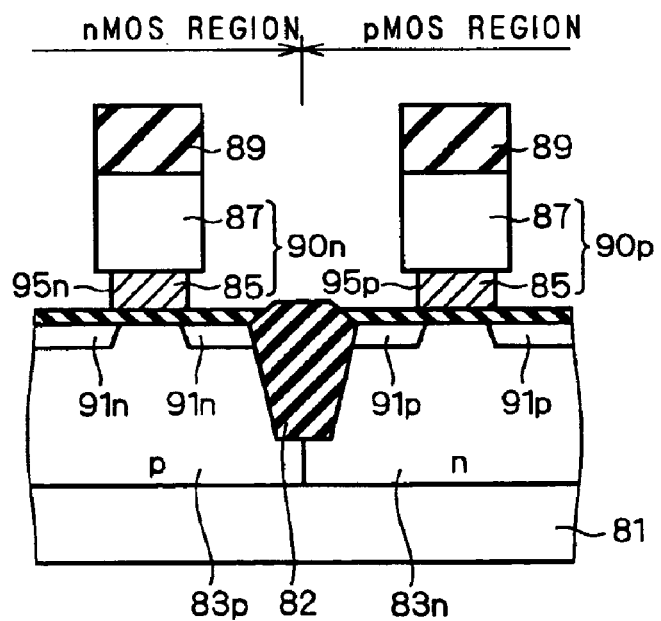

Next, a silicon nitride film 89, to be used as a hard mask in a later process, is formed on the polysilicon film 87. Then, a photoresist (not shown) having a predetermined aperture pattern is formed on the silicon nitride film 89. The silicon nitride film 89 is patterned with this photoresist serving as a mask. Then, with the patterned silicon nitride film 89 serving as a mask and the gate insulating film 84 serving as an etching stopper, the polysilicon films 87 and 85 are successively etched by plasma anisotropic etching. This etching leaves, as shown in FIG. 16, gate electrodes 90n and 90p formed on the gate insulating film 84 in the nMOS region and the pMOS region, respectively.

Each of the gate electrodes 90n and 90p includes the polysilicon films 85 and 87 with the silicon nitride film 89 remaining on its top surface. A notch is formed at the bottom portion on a side surface of respective gate electrodes 90n and 90p.

As described above, the speed of etching applied to the polysilicon film becomes high with increasing concentration of n-type impurities contained in the polysilicon film. According to the third embodiment of the present invention, the polysilicon film 85 serving as a lower layer has the phosphorus concentration higher than that of the polysilicon film 87 serving as an upper layer. Thus, the etching rate of the polysilicon film 85 is higher than that of the polysilicon film 87. As a result, in each of the gate electrodes 90n and 90, the side surface of the polysilicon film 85 is recessed compared with the side surface of the polysilicon film 87. Thus, the notch is formed at the bottom portion on the side surface of respective gate electrodes 90n and 90p.

Furthermore, according to the third embodiment of the present invention, the polysilicon film 85 in the nMOS region and the polysilicon film 85 in the pMOS region have the same phosphorus concentration. Accordingly, the notch 95n formed at the gate electrode 90n is identical in size with the notch 95p formed at the gate electrode 90p.

Next, a photoresist (not shown) having an aperture pattern exposing the pMOS region is formed on the gate insulating film 84 and on the element isolation insulating film 82. With this photoresist and the silicon nitride films 89 each serving as a mask, the ion-implantation using, for example, boron is performed. Then, after finishing the boron ion-implantation, the photoresist is removed. Thus, p-type extension regions 91p serving as p-type impurity regions are formed in the upper surface of the well region 83n, as shown in FIG. 16.

Next, a photoresist (not shown) having an aperture pattern exposing the nMOS region is formed on the gate insulating film 84 and on the element isolation insulating film 82. With this photoresist and the silicon nitride films 89 each serving as a mask, the ion-implantation using, for example, arsenic is performed. Then, after finishing the arsenic ion-implantation, the photoresist is removed. Thus, n-type extension regions 91n serving as n-type impurity regions are formed in the upper surface of the well region 83p, as shown in FIG. 16.

Figure 17:
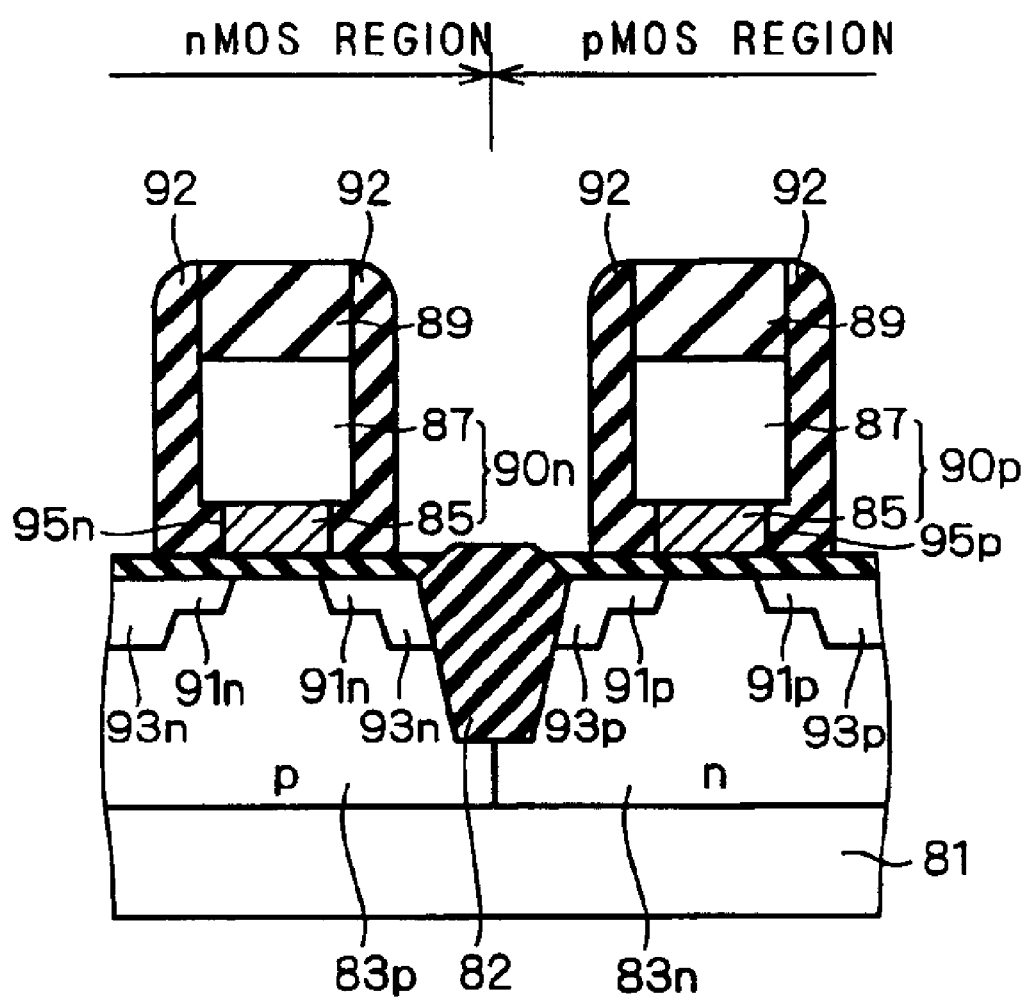

Next, a silicon nitride film serving as filler for the notches 95n and 95p is deposited on the entire surface. Then, the applied silicon nitride film is subjected to the anisotropic dry etching having a higher etching rate in the depth direction of the semiconductor substrate 81, to leave sidewalls 92 made of the silicon nitride film on the side surfaces of respective gate electrodes 90n and 90p and also on the side surfaces of silicon nitride films 89 as shown in FIG. 17. Accordingly, respective notches 95n and 95p are filled with the sidewalls 92.

Next, p-type impurity regions 93p are formed in the upper surface of the well region 83n, and n-type impurity regions 93n are formed in the upper surface of the well region 83p. More specifically, first of all, a photoresist (not shown) having an aperture pattern exposing the pMOS region is formed on the gate insulating film 84 and on the element isolation insulating film 82. With this photoresist, the silicon nitride films 89, and the sidewalls 92 each serving as a mask, the ion-implantation using, for example, boron is performed. Then, after finishing the boron ion-implantation, the photoresist is removed. The boron ion-implanting amount in this case is set to be higher than the boron ion-implanting amount in the formation of p-type extension regions 91p. With this setting, as shown in FIG. 17, p-type impurity regions 93p having an impurity concentration higher than that of the p-type extension regions 91p are formed in the upper surface of the well region 83n.

Next, a photoresist (not shown) having an aperture pattern exposing the nMOS region is formed on the gate insulating film 84 and on the element isolation insulating film 82. With this photoresist, the silicon nitride films 89, and the sidewalls 92 each serving as a mask, the ion-implantation using, for example, arsenic is performed. Then, after finishing the arsenic ion-implantation, the photoresist is removed. The arsenic ion-implanting amount in this case is set to be higher than the arsenic ion-implanting amount in the formation of n-type extension regions 91n. With this setting, as shown in FIG. 17, n-type impurity regions 93n having an impurity concentration higher than that of the n-type extension regions 91n are formed in the upper surface of the well region 83p.

Through the above-described processes, a plurality of source/drain regions respectively constituted by the p-type extension region 91p and the p-type impurity region 93p and mutually spaced at a predetermined distance are provided in the upper surface of the well region 83n. Furthermore, a plurality of source/drain regions respectively constituted by the n-type extension region 91n and the n-type impurity region 93n and mutually spaced at a predetermined distance are provided in the upper surface of the well region 83p.

Next, an annealing treatment is performed to activate the impurities contained in the above-described source/drain regions. Through this annealing treatment, the pMOS transistor having a buried channel structure is formed in the pMOS region, while the nMOS transistor having a surface channel structure is formed in the nMOS region.

As described above, according to the manufacturing method for a semiconductor device in accordance with the third embodiment of the present invention, it is possible to form the notches having desirable configurations at respective gate electrodes even if the transistor is a CMOS transistor incorporated in a memory-logic mixed mounting type semiconductor device. Accordingly, the third embodiment of the present invention makes it possible to accurately realize a proper gate overlap amount Lov and optimize the performance of the semiconductor device.

Furthermore, according to the third embodiment of the present invention, each of the polysilicon films 85 and 87 is made of a doped polysilicon film. The phosphorus distribution in respective polysilicon films 85 and 87 is substantially uniform. Furthermore, according to the third embodiment of the present invention, no phosphorus ion-implantation is executed for the polysilicon films 85 and 87. The phosphorus concentration steeply changes in the boundary between the upper-layer polysilicon film 87 and the lower-layer polysilicon film 85. The speed of etching applied to the polysilicon film abruptly changes. Hence, a desirable notch configuration is easily obtained.

Furthermore, even in a case where the ion-implantation is applied to the polysilicon film as described in the first and second embodiments of the present invention, performing the annealing treatment after accomplishing the ion-implantation makes it possible to provide uniform phosphorus distribution in the polysilicon film. However, the uniformity in the phosphorus distribution obtained in this case is not so excellent compared with that in the doped polysilicon film. Accordingly, as disclosed in the third embodiment of the present invention, it is possible to realize desired notch configuration by adopting the doped polysilicon films for the upper-layer polysilicon film 87 and the lower-layer polysilicon film 85. It becomes possible to assure uniform and stable notch configuration for the same wafer or for a plurality of wafers.

Furthermore, according to the third embodiment of the present invention, the lower-layer polysilicon film 85 is subjected to no ion-implantation. Thus, during ion-implantation, no phosphorus ions penetrate the polysilicon film 85 and reach the semiconductor substrate 1.

Furthermore, according to the manufacturing method for a semiconductor device in accordance with the third embodiment of the present invention, the polysilicon film becoming a gate electrode is not subjected to the ion-implantation using the n-type impurities. Hence, unlike the first and second embodiments of the present invention, it is difficult to form a plurality of gate electrodes having the notches mutually different in size. However, the manufacturing method for a semiconductor device in accordance with the third embodiment of the present invention can be effectively applied to a semiconductor device including a plurality of transistors being identical in optimum notch size or for a semiconductor device the entire performance of which is substantially dependent on the size of a specific transistor.

Furthermore, according to the third embodiment of the present invention, the upper-layer polysilicon film 87 is made of a doped polysilicon film containing phosphorus. However, similar effect will be obtained even when the upper-layer polysilicon film 87 is made of a non-doped polysilicon film.

Furthermore, according to the above-described first to third embodiments of the present invention, the n-type impurities contained in the polysilicon film are phosphorus. However, phosphorus can be replaced with other n-type impurities such as arsenic.

While the invention has been shown and described in detail, the foregoing description is in all aspects illustrative and not restrictive. It is therefore understood that numerous other modifications and variations can be devised without departing from the scope of the invention.

What is claimed is:

1. A method of manufacturing a semiconductor device comprising the steps of:
   (a) forming a gate insulating film on a semiconductor substrate;
   (b) forming a first polysilicon film containing n-type impurities on said gate insulating film;
   (c) forming a second polysilicon film on said first polysilicon film, said second polysilicon film being a polysilicon film containing said impurities and having a concentration of said impurities lower than that of said first polysilicon film or a non-doped polysilicon film;
   (d) forming a gate electrode including said first and second polysilicon films on said gate insulating film by partly etching said first and second polysilicon films from the above of said second polysilcon film; and
   (e) forming a sidewall on a side surface of said gate electrode after accomplishing said step (d),
   wherein the etching applied to said first and second polysilicon films in said step (d) forms an etched side surface of said first polysilicon film recessed compared with that of said second polysilicon film, thereby leaving a notch on said side surface of said gate electrode, and
   said step (e) is performed in such a manner that said notch is filled with said sidewall.

2. The method of manufacturing a semiconductor device according to claim 1, wherein
   said first polysilicon film is a doped polysilicon film containing said impurities, and
   said second polysilicon film is a doped polysilicon film containing said impurities or said non-doped polysilicon film.

3. The method of manufacturing a semiconductor device according to claim 1, wherein said second polysilicon film is a doped polysilicon film containing said impurities or said non-doped polysilicon film, said step (b) further comprises the steps of:

(b-1) forming a third polysilicon film on said gate insulating film; and (b-2) ion-implanting said impurities into said third polysilicon film, and said first polysilicon film is said third polysilicon film obtained after accomplishing said step (b-2), wherein said manufacturing method further comprises the step of:

(f) applying an annealing treatment to the structure obtained after accomplishing said step (b), said step (f) being performed prior to said step (d).

4. The method of manufacturing a semiconductor device according to claim 1, wherein said step (b) further comprises the steps of:

(b-1) forming a third polysilicon film on said gate insulating film;

(b-2) ion-implanting said impurities into a first region of said third polysilicon film with a first implanting amount; and (b-3) ion-implanting said impurities into a second region of said third polysilicon film with a second implanting amount, said second implanting amount being larger than said first implanting amount, and said first polysilicon film is said third polysilicon film obtained after accomplishing said step (b-3), wherein said gate electrode includes second and third gate electrodes, in said step (d), said second and third gate electrodes are formed on said gate insulating film by partly etching said first and second regions of said third polysilicon film, said second gate electrode including said first region of said third polysilicon film and said second polysilicon film and said third gate electrode including said second region of said third polysilicon film and said second polysilicon film, and said notch formed on the side surface of said second gate electrode is smaller than said notch formed on the side surface of said third gate electrode.

5. The method of manufacturing a semiconductor device according to claim 4, wherein said second polysilicon film is a doped polysilicon film containing said impurities or said non-doped polysilicon film, and said manufacturing method further comprises the step of:

(f) applying an annealing treatment to the structure obtained after accomplishing said step (b), said step (f) being performed prior to said step (d).

* * * * *